(12) United States Patent
Kim et al.

(10) Patent No.: US 9,886,379 B2
(45) Date of Patent: Feb. 6, 2018

(54) SOLID STATE DRIVING INCLUDING NONVOLATILE MEMORY, RANDOM ACCESS MEMORY AND MEMORY CONTROLLER

(71) Applicant: SAMSUNG ELECTRONICS CO., LTD., Suwon-si, Gyeonggi-do (KR)

(72) Inventors: Hyunjin Kim, Hwaseong-si (KR); Kitae Park, Seongnam-si (KR); Seonkyoo Lee, Hwaseong-si (KR); Jeongdon Ihm, Seongsam-si (KR); Youngjin Jeon, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 85 days.

(21) Appl. No.: 14/668,015

(22) Filed: Mar. 25, 2015

(65) Prior Publication Data

US 2015/0378885 A1    Dec. 31, 2015

(30) Foreign Application Priority Data

Jun. 27, 2014  (KR) .......................... 10-2014-0080048

(51) Int. Cl.
*G06F 12/02* (2006.01)
*G11C 16/10* (2006.01)
*G06F 13/16* (2006.01)
*G11C 7/10* (2006.01)

(52) U.S. Cl.
CPC ...... *G06F 12/0246* (2013.01); *G06F 13/1673* (2013.01); *G11C 16/102* (2013.01); *G06F 2212/7201* (2013.01); *G11C 7/1072* (2013.01)

(58) Field of Classification Search
None
See application file for complete search history.

(56) References Cited

U.S. PATENT DOCUMENTS

| | | | | |
|---|---|---|---|---|
| 5,822,251 A | * | 10/1998 | Bruce ................ | G06F 11/1068 365/185.33 |
| 6,370,628 B2 | | 4/2002 | Beppu | |
| 6,721,820 B2 | * | 4/2004 | Zilberman .............. | G06F 13/28 710/22 |
| 7,126,873 B2 | * | 10/2006 | See ........................ | G11C 16/02 365/185.11 |
| 7,200,021 B2 | | 4/2007 | Raghuram | |

(Continued)

FOREIGN PATENT DOCUMENTS

JP    2004240993 A    8/2004
KR   1020120138566 A   12/2012

OTHER PUBLICATIONS

EE Herald. "Flash memory basics and its interface to a processor." Published Mar. 5, 2013. <https://web.archive.org/web/20130305003451/http://www.eeherald.com/section/designguide/esmod16.html>.*

(Continued)

*Primary Examiner* — Charles Rones
*Assistant Examiner* — Hewy Li
(74) *Attorney, Agent, or Firm* — Volentine & Whitt, PLLC

(57) ABSTRACT

A solid state drive includes a nonvolatile memory, a random access memory, and a memory controller. The nonvolatile memory contains a plurality of nonvolatile memories chips and a buffer chip. The memory controller is formed of an internal bus, a host interface, a memory interface, a buffer control circuit, and a processor.

15 Claims, 13 Drawing Sheets

(56) References Cited

U.S. PATENT DOCUMENTS

| | | | |
|---|---|---|---|
| 7,765,359 B2 | 7/2010 | Kang et al. | |
| 7,843,758 B2 * | 11/2010 | Byeon | G06F 13/1684 |
| | | | 365/185.11 |
| 8,171,204 B2 | 5/2012 | Chow et al. | |
| 8,266,368 B2 * | 9/2012 | Shiraishi | G06F 13/1647 |
| | | | 711/103 |
| 8,585,410 B2 | 11/2013 | Nagadomi | |
| 8,611,123 B2 | 12/2013 | Koh | |
| 9,507,704 B2 * | 11/2016 | Tuers | G06F 12/0238 |
| 2008/0034159 A1 * | 2/2008 | Kim | G06F 13/1673 |
| | | | 711/115 |
| 2008/0162790 A1 * | 7/2008 | Im | G11O 5/02 |
| | | | 711/103 |
| 2010/0229032 A1 * | 9/2010 | Lee | G06F 11/1044 |
| | | | 714/6.12 |
| 2010/0250848 A1 * | 9/2010 | Kim | G06F 3/0619 |
| | | | 711/114 |
| 2012/0215958 A1 | 8/2012 | Fai et al. | |

OTHER PUBLICATIONS

Wong, Doug. "Understanding and selecting higher performance NAND architectures." Published Dec. 9, 2010. <http://embedded.com/print/4211387>.*

* cited by examiner

US 9,886,379 B2

SOLID STATE DRIVING INCLUDING NONVOLATILE MEMORY, RANDOM ACCESS MEMORY AND MEMORY CONTROLLER

CROSS-REFERENCE TO RELATED APPLICATIONS

A claim for priority under 35 U.S.C. §119 is made to Korean Patent Application No. 10-2014-0080048 filed Jun. 27, 2014, in the Korean Intellectual Property Office, the entire contents of which are hereby incorporated by reference.

BACKGROUND

The present disclosure described herein relates to a semiconductor memory, and more particularly, to a solid state drive including a nonvolatile memory, a random access memory, and a memory controller.

A storage device is a device that stores data according to a control of a host device, such as a computer, a smart phone, a smart pad, and so on. The storage device may contain a device which stores data on a magnetic disk such as a Hard Disk Drive, or a device which stores data on a semiconductor memory, in particular on a nonvolatile memory, such as a Solid State Drive (SSD) or a memory card.

A nonvolatile memory may be a Read Only Memory (ROM), a Programmable ROM (PROM), an Electrically Programmable ROM (EPROM), an Electrically Erasable and Programmable ROM EEPROM), a flash memory, a Phase-change RAM (PRAM), a Magnetic RAM (MRAM), a Resistive RAM (RRAM), or a Ferroelectric RAM (FRAM).

Advancements in semiconductor fabrication technology have enabled a continued increase in the capacity of a solid state drive. As example, increase capacity may be accomplished through overlapping of semiconductor memory chips and increased integration of a semiconductor memory chip.

Generally, however, an increase in the capacity of the solid state drive hinders the reliability of a storage device. For example, the higher the number of semiconductor chips that are overlapped, the greater are certain resistance components of the overlapped chips. A toggle speed of a channel that is used to communicate with the semiconductor chips is hindered due to the increase in resistance components, thereby resulting in an increase in skew.

SUMMARY

One aspect of embodiments of the present disclosure is directed to provide a solid state drive comprising a nonvolatile memory, a random access memory, and a memory controller adapted to control the nonvolatile memory and the random access memory. The nonvolatile memory may include a plurality of nonvolatile memory chips, and a buffer chip connected between the plurality of nonvolatile memory chips and the memory controller. The memory controller may comprise an internal bus, a host interface adapted to communicate with an external host device, a memory interface adapted to communicate with the nonvolatile memory, a buffer control circuit adapted to directly exchange data with the host interface without passing through the internal bus, to directly exchange data with the memory interface without passing through the internal bus and to directly exchange data with the random access memory without passing through the internal bus, and a processor adapted to receive a first command and a first address from the host interface through the internal bus, to produce a second command and a second address from the first command and the first address, to transmit the second command and the second address to the memory interface through the internal bus and to control the buffer control circuit through the internal bus.

In exemplary embodiments, the memory controller may further comprise a second random access memory adapted to temporarily store the first command, the first address, the second command, and the second address through the internal bus.

In exemplary embodiments, the memory interface may be connected with the buffer chip of the nonvolatile memory through a plurality of input/output lines. The second command and the second address may be transferred from the memory interface to the buffer chip through the plurality of input/output lines. Data may be exchanged between the memory interface and the buffer chip through the plurality of input/output lines.

In exemplary embodiments, the buffer chip of the nonvolatile memory may be connected in common to the plurality of nonvolatile memory chips through a plurality of input/output lines. The second command and the second address may be transmitted from the buffer chip to the plurality of nonvolatile memory chips through the plurality of input/output lines. Data may be exchanged between the buffer chip and the plurality of nonvolatile memory chips through the plurality of input/output lines.

In exemplary embodiments, the plurality of nonvolatile memory chips may be divided into a first group and a second group. The plurality of nonvolatile memory chips in the first group may be connected in common to the buffer chip through first input/output lines, and the plurality of nonvolatile memory chips in the second group may be connected in common to the buffer chip through second input/output lines.

In exemplary embodiments, the memory interface may transmit a data strobe signal, a read enable signal, a command latch enable signal, an address latch enable signal, a write enable signal, and a write protection signal to the buffer chip through control lines.

In exemplary embodiments, the buffer chip may transmit a data strobe signal, a read enable signal, a command latch enable signal, an address latch enable signal, a write enable signal, and a write protection signal in common to the plurality of nonvolatile memory chips through control lines.

In exemplary embodiments, the plurality of nonvolatile memory chips may be divided into a first group and a second group. The plurality of nonvolatile memory chips in the first group may be connected in common to the buffer chip through first input/output lines, and the plurality of nonvolatile memory chips in the second group may be connected in common to the buffer chip through second input/output lines. The buffer chip may transmit a data strobe signal, a read enable signal, a command latch enable signal, an address latch enable signal, a write enable signal, and a write protection signal in common to the plurality of nonvolatile memory chips of the first and second groups through control lines.

In exemplary embodiments, the buffer chip may provide the plurality of nonvolatile memory chips with chip enable signals corresponding to the plurality of nonvolatile memory chips through chip enable lines, respectively.

In exemplary embodiments, the plurality of nonvolatile memory chips may transmit a plurality of ready/busy signals to the buffer chip through a plurality of ready/busy lines, respectively.

In exemplary embodiments, the solid state drive may further comprise a plurality of first nonvolatile memories. The nonvolatile memory and the plurality of first nonvolatile memories may communicate with the memory interface through a first common channel, and each of the plurality of first nonvolatile memory has the same structure as the nonvolatile memory.

In exemplary embodiments, at the first common channel, the nonvolatile memory and the plurality of first nonvolatile memories may use, in common, input/output lines through which the second command, the second address, and data are transmitted.

In exemplary embodiments, at the first common channel, the nonvolatile memory and the plurality of first nonvolatile memories may receive chip enable signals through separate chip enable lines, respectively.

In exemplary embodiments, each of the plurality of nonvolatile memory chips may include a plurality of cell strings arranged on a substrate along rows and columns. Each of the plurality of cell strings may include at least one ground selection transistor, a plurality of memory cells, and at least one string selection transistor sequentially stacked on the substrate in a direction perpendicular to the substrate.

Another aspect of embodiments of the present disclosure is directed to provide a solid state drive comprising first and second nonvolatile memories, a random access memory, and a memory controller adapted to control the random access memory, to control the first nonvolatile memories through a first channel, and to control the second nonvolatile memories through a second channel. Each of the first and second nonvolatile memories may comprise a plurality of nonvolatile memory chips, and a buffer chip connected between the plurality of nonvolatile memory chips and the memory controller. The memory controller may comprise an internal bus, a host interface adapted to communicate with an external host device, a memory interface adapted to communicate with the first and second nonvolatile memories through the first and second channels, a buffer control circuit adapted to directly exchange data with the host interface without passing through the internal bus, to directly exchange data with the memory interface without passing through the internal bus and to directly exchange data with the random access memory without passing through the internal bus, and a processor adapted to receive a first command and a first address from the host interface through the internal bus, to produce a second command and a second address from the first command and the first address, to transmit the second command and the second address to the memory interface through the internal bus and to control the buffer control circuit through the internal bus.

BRIEF DESCRIPTION OF THE FIGURES

The above and other features will become apparent from the following description with reference to the following figures, wherein similar reference numerals refer to similar parts throughout the various figures unless otherwise specified, and wherein.

DETAILED DESCRIPTION

Figure 1:
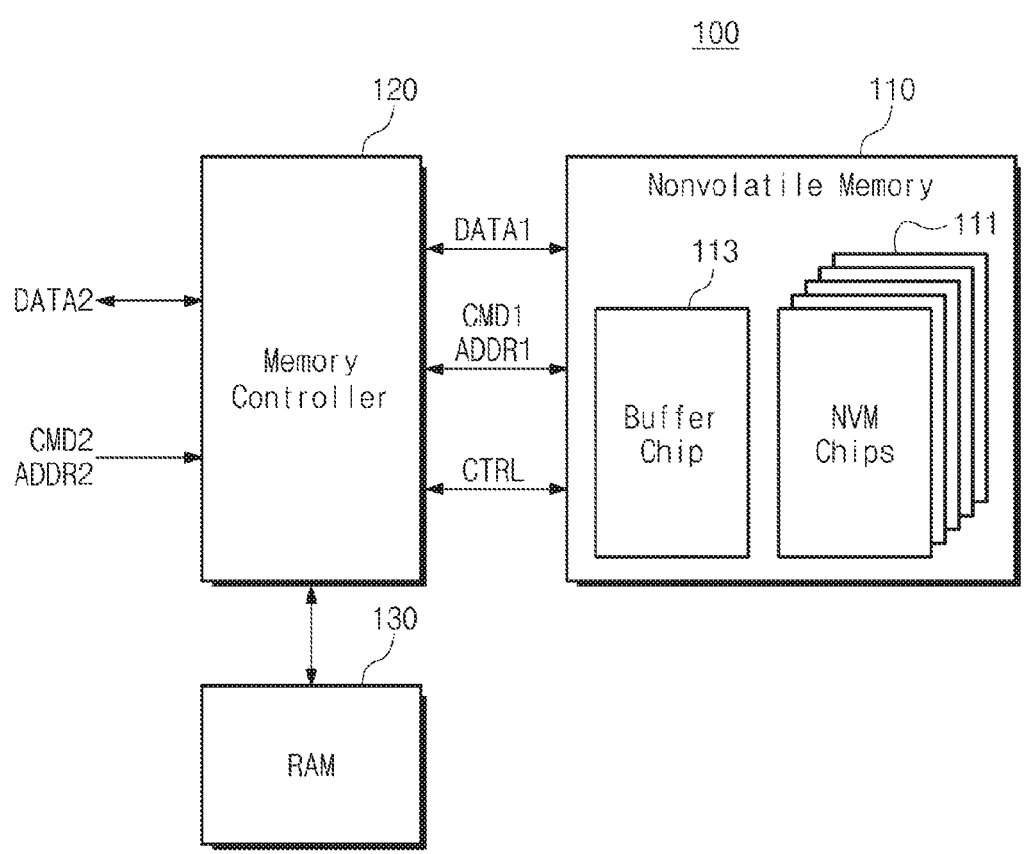
FIG. 1 is a block diagram schematically illustrating a solid state drive according to an embodiment of the present disclosure.

Embodiments will be described in detail with reference to the accompanying drawings. The present disclosure, however, may be embodied in various different forms, and should not be construed as being limited only to the illustrated embodiments. Rather, these embodiments are provided as examples so that this disclosure will be thorough and complete, and will fully convey the concept of the present disclosure to those skilled in the art. Accordingly, known processes, elements, and techniques are not described with respect to some of the embodiments of the present disclosure. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a solid state drive 100 according to an embodiment of the present disclosure. Referring to FIG. 1, the solid state drive 100 may contain a nonvolatile memory 110, a memory controller 120, and a RAM 130.

The nonvolatile memory 110 may perform read, write, and erase operations according to a control of the memory controller 120. The nonvolatile memory 110 may exchange first data DATA1 with the memory controller 120. For example, the nonvolatile memory 110 may receive write data from the memory controller 120 and may write the write data. The nonvolatile memory 110 may perform a read operation and may output read data to the memory controller 120.

The nonvolatile memory 110 may receive a first command CMD1 and a first address ADDR1 from the memory controller 120. The nonvolatile memory 110 may exchange a control signal CTRL with the memory controller 120. For example, the nonvolatile memory 110 may receive, from the memory controller 120, at least one of a chip enable signal /CE for selecting at least one of a plurality of semiconductor chips constituting the nonvolatile memory 110, a command latch enable signal CLE indicating that a signal received from the memory controller 120 is the first command CMD1, an address latch enable signal ALE indicating that a signal received from the memory controller 120 is the first address ADDR1, a read enable signal /RE that is received from the memory controller 120 at a read operation, is periodically toggled and is used to tune timing, a write enable signal /WE activated by the memory controller 120 when the first command CMD1 or the first address ADDR1 is transmitted, a write protection signal /WP activated by the memory controller 120 to prevent unintended writing or erasing when a power changes, and a data strobe signal DQS that is periodically toggled in order to adjust input synchronization about the first data DATA1 and is generated by the memory controller 120 at a write operation. For example, the nonvolatile memory 110 may output, to the memory controller 120, at least one of a ready/busy signal R/nB indicating whether the nonvolatile memory 110 is performing a program, erase or read operation, and the data strobe signal DQS that is periodically toggled in order to adjust output synchronization about the first data DATA1 and is generated from the read enable signal /RE.

The nonvolatile memory 110 may contain a plurality of nonvolatile memory chips 111 and a buffer chip 113. The plurality of nonvolatile memory chips 111 may communicate with the memory controller 120 through the buffer chip 113. The buffer chip 113 may interface communications between the plurality of nonvolatile memory chips 111 and the memory controller 120. The buffer chip 113 may transfer data between the memory controller 120 and the plurality of nonvolatile memory chips 111. The buffer chip 113 may temporarily store data exchanged between the memory controller 120 and the plurality of nonvolatile memory chips 111, and then may output the temporarily stored data.

The nonvolatile memory 110 may include a flash memory. However, the present disclosure is not limited thereto. For example, the nonvolatile memory 110 may incorporate at least one of nonvolatile memories, such as a Phase-change RAM (PRAM), a Magnetic RAM (MRAM), a Resistive RAM (RRAM), a Ferroelectric RAM (FRAM), and so on.

The memory controller 120 may control the nonvolatile memory 110. For example, under a control of the memory controller 120, the nonvolatile memory 110 may perform a read, write, or erase operation. The memory controller 120 may exchange the first data DATA1 and a control signal CTRL with the nonvolatile memory 110, and may output the first command CMD1 and the first address ADDR1 to the nonvolatile memory 110.

The memory controller 120 may control the nonvolatile memory 110 according to a control of an external host device (not shown). The memory controller 120 may exchange second data DATA2 with the host device, and may receive a second command CMD2 and a second address ADDR2 therefrom.

In exemplary embodiments, the memory controller 120 may exchange the first data DATA1 with the nonvolatile memory 110 by a first unit, and may exchange the second data DATA2 with the host device by a second unit that is different from the first unit.

Based on a first format, the memory controller 120 may exchange the first data DATA1 with the nonvolatile memory 110, and may transmit the first command CMD1 and the first address ADDR1 to the nonvolatile memory 110. Based on a second format that is different from the first format, the memory controller 120 may exchange the second data DATA2 with the host device, and may receive the second command CMD2 and the second address ADDR2 from the host device.

The memory controller 120 may use the RAM 130 as a working memory, a buffer memory, or a cache memory. For example, the memory controller 120 may receive the second data DATA2 from the host device and may store the second data DATA2 in the RAM 130. The memory controller 120 may write the second data DATA2 stored in the RAM 130 at the nonvolatile memory 110 as the first data DATA1. The memory controller 120 may read the first data DATA1 from the nonvolatile memory 110 and may store the first data DATA1 in the RAM 130. The memory controller 120 may output the first data DATA1 stored in the RAM 130 to the host device as the second data DATA2. The memory controller 120 may store data read from the nonvolatile memory 110 to the RAM 130 and may write the data stored in the RAM 130 back at the nonvolatile memory 110.

The memory controller 120 may store data or codes, needed to manage the nonvolatile memory 110, to the RAM 130. For example, the memory controller 120 may read data or codes, needed to manage the nonvolatile memory 110, from the nonvolatile memory 110 and may load the read data or codes on the RAM 130 for driving.

The RAM 130 may include at least one of a variety of random access memories, such as, but not limited to, a static RAM (SRAM), a dynamic RAM (DRAM), a synchronous DRAM (SDRAM), a Phase-change RAM (PRAM), a Magnetic RAM (MRAM), a Resistive RAM (RRAM), a Ferroelectric RAM (FRAM), and so on.

The solid state drive 100 may perform an operation of writing, reading or erasing data according to a request of the host device. The solid state drive 100 may include memory cards, such as a personal computer memory card international association (PCMCIA), a compact flash card, a smart media card (SMC), a memory stick, a multimedia card (MMC), a secure digital (SD) card, a USB (Universal Serial Bus) memory card, a universal flash storage (UFS), and so on. The solid state drive 100 may include embedded memories, such as an embedded MultiMedia Card (eMMC), a UFS, a Perfect Page New (PPN), and so on.

Figure 2:
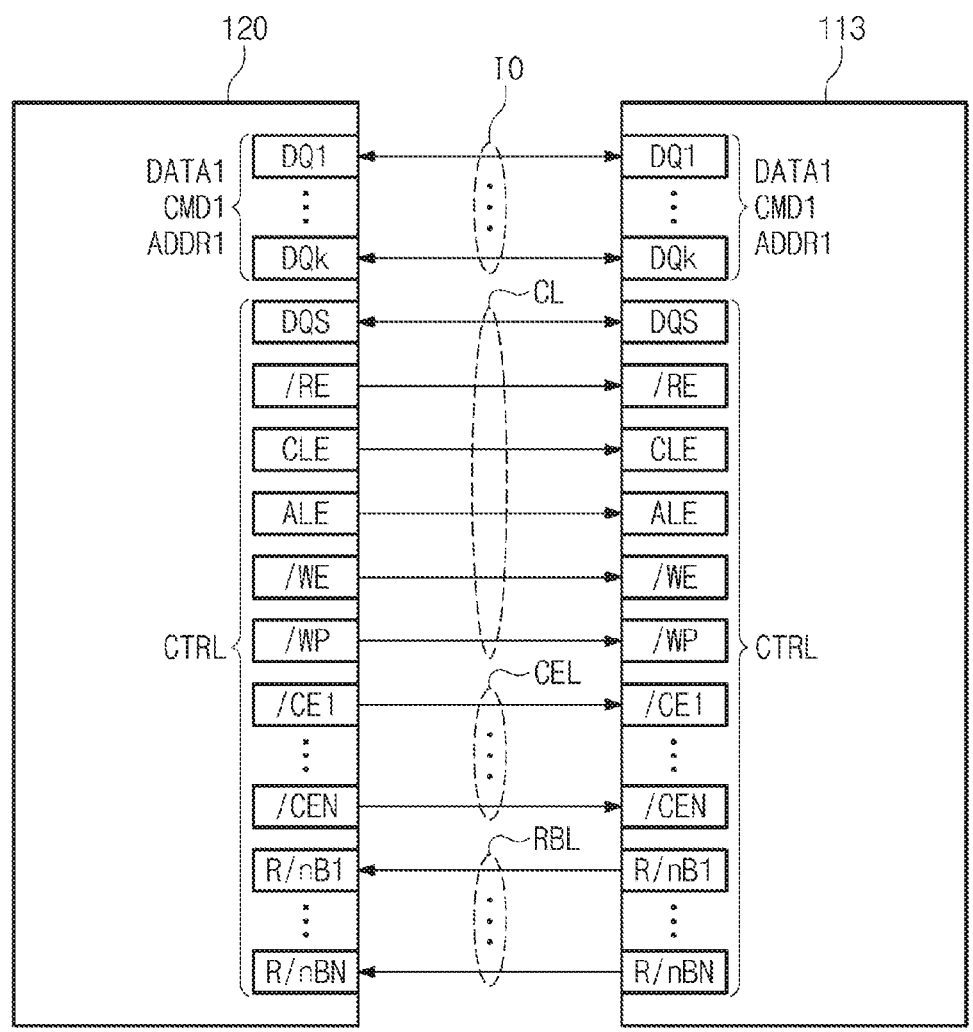
FIG. 2 is a block diagram schematically illustrating an interconnection between a memory controller and a buffer chip.

FIG. 2 is a block diagram schematically illustrating an interconnection between a memory controller 120 and a buffer chip 113. Referring to FIG. 2, an information exchange between a memory controller 120 and a buffer chip 113 may be made in common through input/output lines IO. For example, first data DATA1, a first command CMD1, and a first address ADDR1 may be exchanged between the memory controller 120 and the buffer chip 113 through the input/output lines IO. Each of the memory controller 120 and the buffer chip 130 may contain a plurality of input/output pads DQ1 to DQk. The plurality of input/output pads DQ1 to DQk of the memory controller 120 may be connected to the plurality of input/output pads DQ1 to DQk of the buffer chip 113 through the input/output lines IO, respectively. The first data DATA1, the first command CMD1, and the first address ADDR1 may be exchanged between the memory controller 120 and the buffer chip 113 through the plurality of input/output pads DQ1 to DQk and the input/output lines IO.

For example, signals that are transmitted through the plurality of input/output pads DQ1 to DQk and the input/output lines IO may be identified as the first data DATA1, the first command CMD1, or the first address ADDR1 according to a shape of the control signal CTRL. For example, the number of the input/output pads DQ1 to DQk may be 8, 16, or 32. However, the present disclosure is not limited thereto.

Between the memory controller 120 and the buffer chip 113, the control signal CTRL may be exchanged through control lines CL, chip enable lines CEL, and ready/busy lines RBL. Each of the memory controller 120 and the buffer chip 113 may contain pads for transmitting a data strobe signal DQS, a read enable signal /RE, a command latch enable signal CLE, an address latch enable signal ALE, a write enable signal /WE, and a write protection signal /WP. Corresponding pads of the memory controller 120 and the buffer chip 113 may be connected through the control lines CL, respectively.

Each of the memory controller 120 and the buffer chip 113 may contain pads for transmitting chip enable signals /CE1 through /CEN, and corresponding pads of the memory controller 120 and the buffer chip 113 may be connected through the chip enable lines CEL, respectively.

Each of the memory controller 120 and the buffer chip 113 may contain pads for exchanging ready/busy signals R/nB1 through R/nBN, and corresponding pads of the memory controller 120 and the buffer chip 113 may be connected through the ready/busy lines RBL, respectively.

Figure 3:
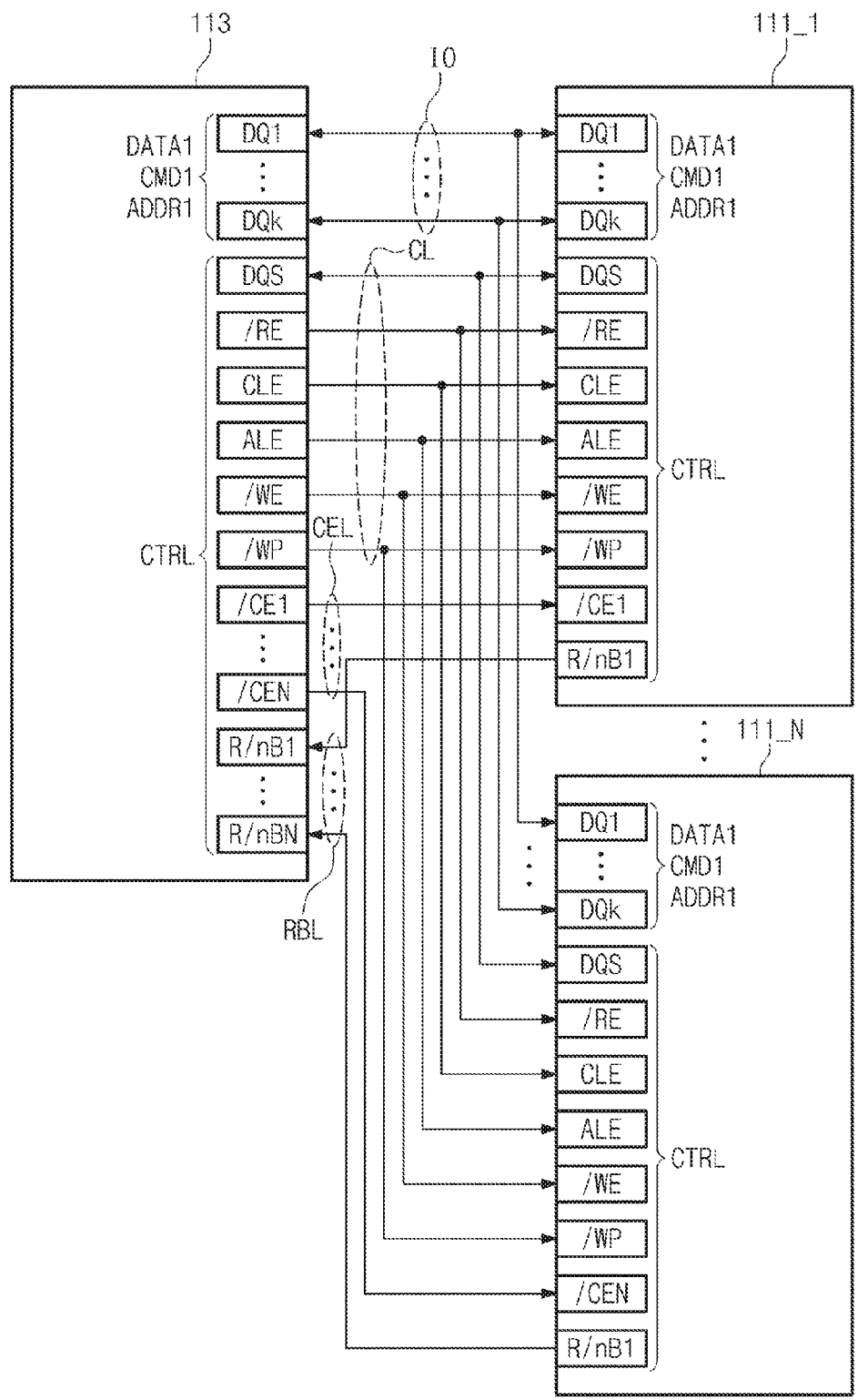
FIG. 3 is a block diagram schematically illustrating an example of an interconnection between a buffer chip and a plurality of nonvolatile memory chips.

FIG. 3 is a block diagram schematically illustrating an example of an interconnection between a buffer chip 113 and a plurality of nonvolatile memory chips 111_1 through 111_N. Referring to FIG. 3, a plurality of nonvolatile memory chips 111_1 through 111_N may contain a plurality of nonvolatile memory chips 111_1 through 111_N. For example, each of the plurality of nonvolatile memory chips 111_1 through 111_N may be formed of a semiconductor chip.

Each of the buffer chip 113 and the plurality of nonvolatile memory chips 111_1 through 111_N may contain input/output pads DQ1 through DQk. The input/output pads DQ1 through DQk of the buffer chip 113 may be connected to the input/output pads DQ1 through DQk of each of the plurality of nonvolatile memory chips 111_1 through 111_N through input/output lines IO. That is, the plurality of nonvolatile memory chips 111_1 through 111_N may share the input/output lines IO and may communicate with the buffer chip 113.

Between the buffer chip 113 and the plurality of nonvolatile memory chips 111_1 through 111_N, first data DATA1, a first command CMD1, and a first address ADDR1 may be exchanged through the input/output pads DQ1 through DQk and the input/output lines IO. For example, signals that are transmitted through the input/output pads DQ1 through DQk and the input/output lines IO may be identified as the first data DATA1, first command CMD1, or first address ADDR1 according to a shape of the control signal CTRL. For example, the number of the input/output pads DQ1 through DQk may be 8, 16, or 32. However, the present disclosure is not limited thereto.

Between the buffer chip 113 and the plurality of nonvolatile memory chips 111_1 through 111_N, a control signal CTRL may be exchanged through control lines CL, chip enable lines CEL, and ready/busy lines RBL. Each of the buffer chip 113 and the plurality of nonvolatile memory chips 111_1 through 111_N may contain pads for transmitting a data strobe signal DQS, a read enable signal /RE, a command latch enable signal CLE, an address latch enable signal ALE, a write enable signal /WE, and a write protection signal /WP. Corresponding pads of the buffer chip 113 and the plurality of nonvolatile memory chips 111_1 through 111_N may be connected through the control lines CL, respectively. That is, the plurality of nonvolatile memory chips 111_1 through 111_N may share the control lines CL and may communicate with the buffer chip 113.

The buffer chip 113 may contain pads that are used to transmit chip enable signals /CE1 through /CEN and are connected to corresponding chip enable lines CEL. Each of the plurality of nonvolatile memory chips 111_1 through 111_N may contain a pad for receiving one of the chip enable signals /CE1 through /CEN. The buffer chip 113 may transmit the chip enable signals /CE1 through /CEN to the plurality of nonvolatile memory chips 111_1 through 111_N through the chip enable lines CEL, respectively.

The buffer chip 113 may incorporate pads for communication of ready/busy signals R/nB1 through R/nBN, and the pads may be connected to corresponding ready/busy lines RBL, respectively. Each of the plurality of nonvolatile memory chips 111_1 through 111_N comprise a pad for transmitting one of the ready/busy signals R/nB1 through R/nBN. The buffer chip 113 may receive the ready/busy signals R/nB1 through R/nBN from the plurality of nonvolatile memory chips 111_1 through 111_N through the ready/busy lines RBL.

For example, when a memory controller 120 activates one of the chip enable signals /CE1 through /CEN (e.g., logical low level), activates the command latch enable signal CLE (e.g., logical high level), inactivates the address latch enable signal ALE (e.g., logical low level), and makes the write enable signal /WE transit from activation (e.g., logical low level) to inactivation (e.g., logical high level) (i.e., inactivates the write enable signal /WE after activating the write enable signal /WE), the memory controller 120 may output a first command CMD1 through the input/output pads DQ1 through DQk. Also, the buffer chip 113 or a nonvolatile memory chip corresponding to an activated chip enable signal /CE among the plurality of nonvolatile memory chips 111 may recognize that the first command CMD1 is received through the input/output pads DQ1 through DQk.

For example, when activating one of the chip enable signals /CE1 through /CEN (e.g., logical low level), inactivating the command latch enable signal CLE (e.g., logical low level), activating the address latch enable signal ALE (e.g., logical high level), and making the write enable signal /WE transit from activation (e.g., logical low level) to inactivation (e.g., logical high level) (i.e., inactivating the write enable signal /WE after activating the write enable signal /WE), the memory controller 120 may output a first address ADDR1 through the input/output pads DQ1 through DQk. Also, the buffer chip 113 or a nonvolatile memory chip corresponding to an activated chip enable signal /CE among the plurality of nonvolatile memory chips 111 may recognize that the first address ADDR1 is received through the input/output pads DQ1 through DQk.

For example, when activating one of the chip enable signals /CE1 through /CEN (e.g., logical low level), inactivating the command latch enable signal CLE (e.g., logical low level), inactivating the address latch enable signal ALE (e.g., logical low level), inactivating the write enable signal /WE (e.g., logical high level), and inactivating the read enable signal /RE (e.g., logical high level), the memory controller 120 may produce a data strobe signal DQS periodically toggled and may output first data DATA1 through the input/output pads DQ1 through DQk in synchronization with the data strobe signal DQS. Also, the buffer chip 113 or a nonvolatile memory chip corresponding to an activated chip enable signal /CE among the plurality of nonvolatile memory chips 111 may recognize that the first data DATA1 is received through the input/output pads DQ1 through DQk in synchronization with the data strobe signal DQS.

For example, the memory controller 120 may activate one of the chip enable signals /CE1 through /CEN (e.g., logical low level), may inactivate the command latch enable signal CLE (e.g., logical low level), may inactivate the address latch enable signal ALE (e.g., logical low level), may inactivate the write enable signal /WE (e.g., logical high level), and may make the read enable signal /RE periodically toggled. The buffer chip 113 or the plurality of nonvolatile memory chips 111 may produce a data strobe signal DQS periodically toggled, based on the read enable signal /RE that is periodically toggled. The buffer chip 113 or a nonvolatile memory chip corresponding to an activated chip enable signal /CE among the plurality of nonvolatile memory chips 111 may output the first data DATA1 through the input/output pads DQ1 through DQk in synchronization with the data strobe signal DQS. The memory controller 120 may recognize that the first data DATA1 is received through the input/output pads DQ1 through DQk in synchronization with the data strobe signal DQS.

As described with reference to FIGS. 2 and 3, the buffer chip 113 may interface communications between the memory controller 120 and the plurality of nonvolatile memory chips 111_1 through 111_N. In case that the buffer chip 113 does not exist, the input/output pads DQ1 through DQk of the memory controller 120 may be directly connected to the plurality of nonvolatile memory chips 111_1 through 111_N through the input/output lines IO. In this case, loading of the input/output pads DQ1 through DQk of the plurality of nonvolatile memory chips 111_1 through 111_N may be added to the input/output pads DQ1 through DQk of the memory controller 120. For example, now that N input/output pads of the plurality of nonvolatile memory chips 111_1 through 111_N are connected with one input/output pad of the memory controller 120, loading of one input/output pad of the memory controller 120 may increase as much as N times.

In case that the buffer chip 113 according to an embodiment of the present disclosure is provided, one input/output pad of the memory controller 120 may be connected to one input/output pad of the buffer chip 113. This may mean that loading of the input/output pads of the memory controller 120 may be reduced. Thus, it is possible to reduce skew between the memory controller 120 and the plurality of nonvolatile memory chips 111_1 through 111_N. In other words, the reliability of the solid state drive 100 may be improved.

Figure 4:
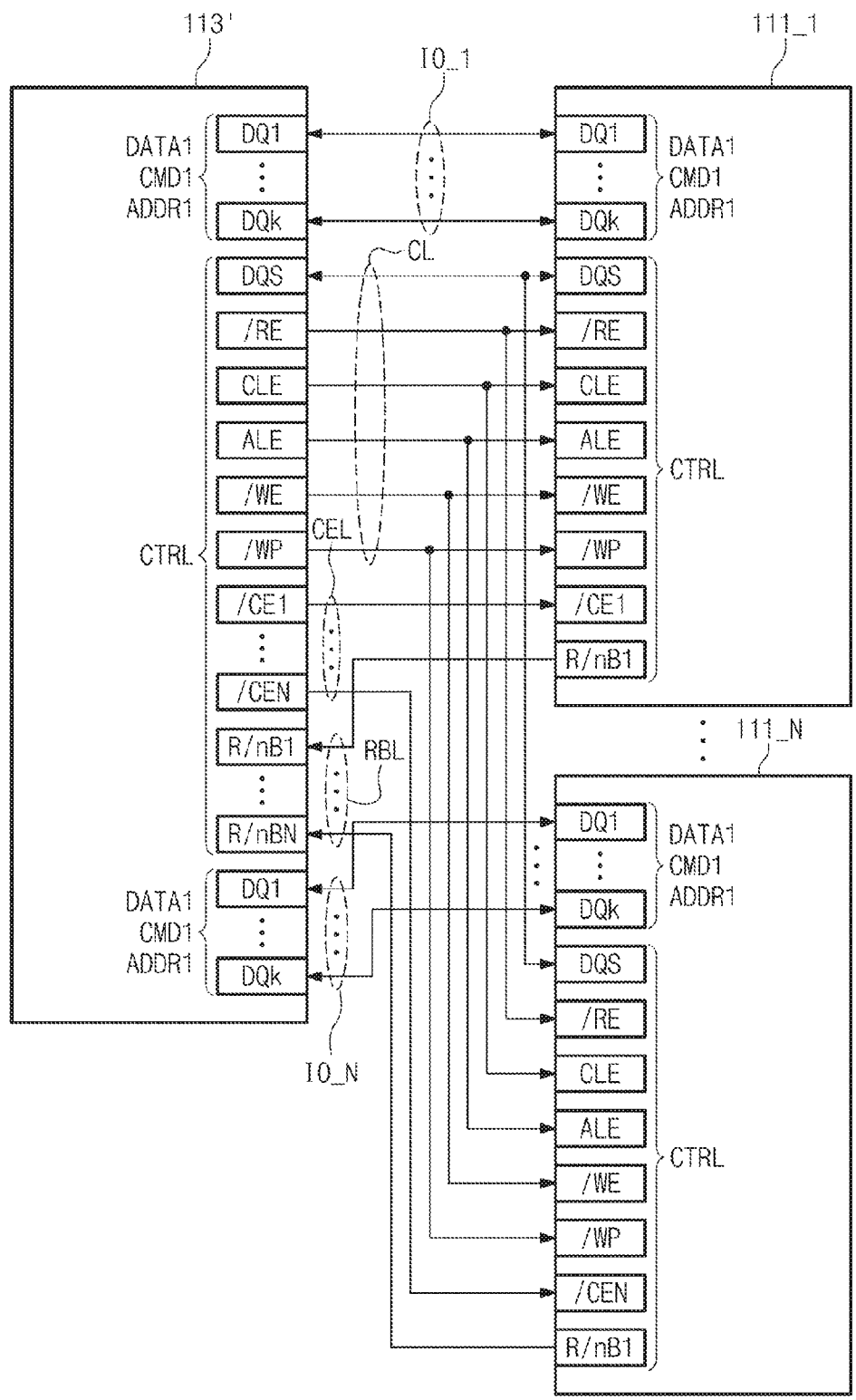
FIG. 4 is a block diagram schematically illustrating an interconnection between a buffer chip and a plurality of nonvolatile memory chips, according to another embodiment of the present disclosure.

FIG. 4 is a block diagram schematically illustrating an interconnection between a buffer chip 113' and a plurality of nonvolatile memory chips 111_1 through 111_N, according to another embodiment of the present disclosure. As compared with the buffer chip 113 shown in FIG. 3, the buffer chip 113' may comprise separate input/output pads DQ1 through DQk for communication with the plurality of nonvolatile memory chips 111_1 through 111_N. The input/output pads DQ1 through DQk for communication between the buffer chip 113' and the plurality of nonvolatile memory chip 111_1 may be different from input/output pads DQ1 through DQk for communication between the buffer chip 113' and the plurality of nonvolatile memory chip 111_N.

For example, the buffer chip 113' may communicate with a first nonvolatile memory chip 111_1 through upper input/output pads DQ1 through DQk and first input/output lines IO_1, and the buffer chip 113' may communicate with an nth nonvolatile memory chip 111_N through lower input/output pads DQ1 through DQk and Nth input/output lines IO_N.

For example, the plurality of nonvolatile memory chips 111_1 through 111_N may be divided into a plurality of groups. Each group may include two or more nonvolatile memory chips. The nonvolatile memory chip groups may communicate with the buffer chip 113' through different input/output pad groups and different input/output line groups.

Figure 5:
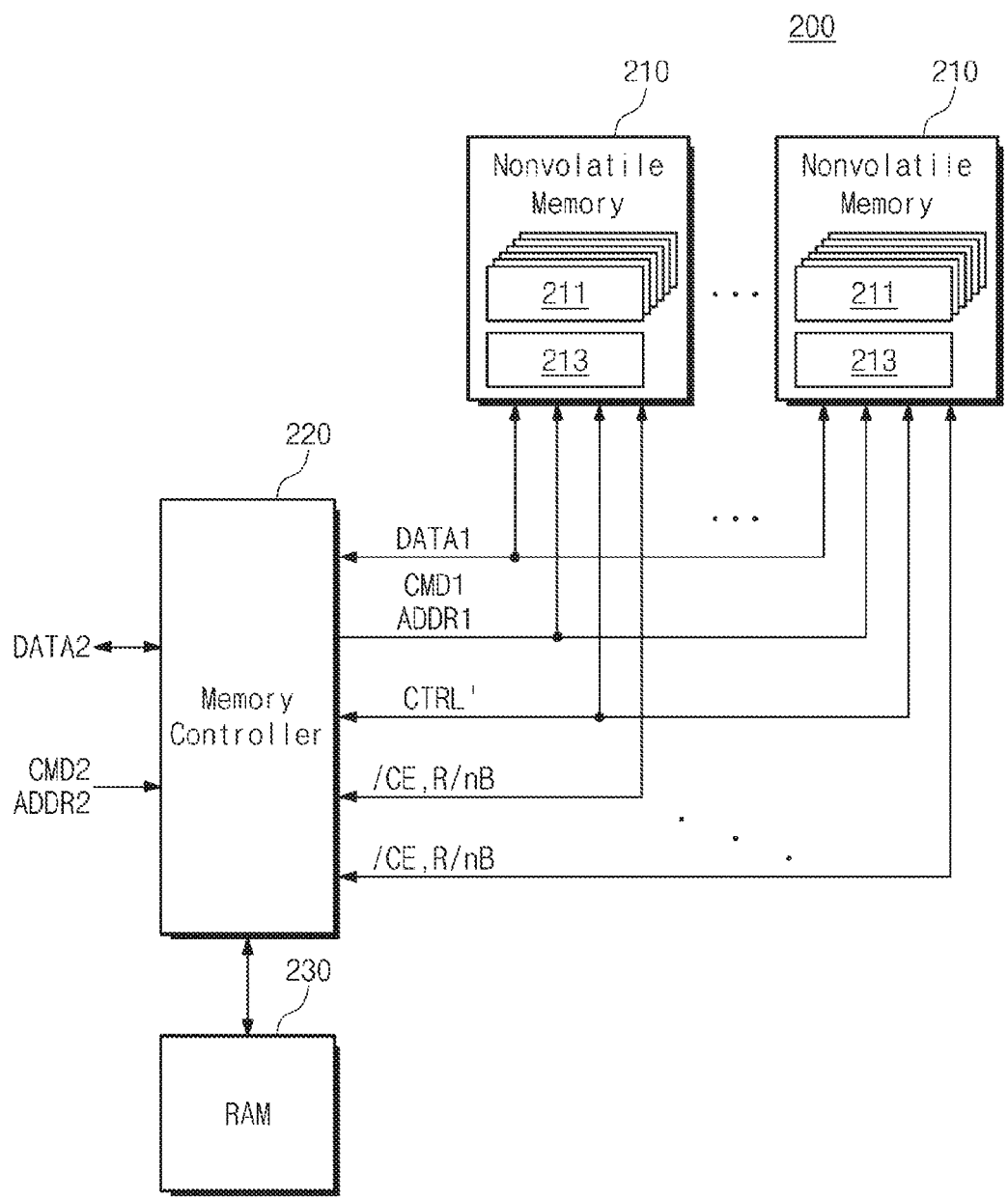
FIG. 5 is a block diagram schematically illustrating a solid state drive according to a second embodiment of the present disclosure.

FIG. 5 is a block diagram schematically illustrating a solid state drive 100 according to a second embodiment of the present disclosure. Referring to FIG. 5, a solid state drive 200 may contain a plurality of nonvolatile memories 210, a memory controller 220, and a RAM 230. Each of the plurality of nonvolatile memories 210 contains a plurality of nonvolatile memory chips 211 and a buffer chip 213. Each of the plurality of nonvolatile memories 210 may have the same structure as a nonvolatile memory 110 described with reference to FIGS. 1 through 3, and may operate in the same way as the nonvolatile memory 110. The buffer chips 213 may interface communications between the plurality of nonvolatile memory chips 211 and the memory controller 210.

The memory controller 220 may exchange first data DATA1, a first command CMD1, and a first address ADDR1 with the plurality of nonvolatile memories 210 through a common channel. The memory controller 220 may exchange a control signal CTRL' with the plurality of nonvolatile memories 210 through the common channel. The control signal CTRL' may include a command latch enable signal CLE, an address latch enable signal ALE, a read enable signal /RE, a write enable signal /WE, and a write protection signal /WP.

A chip enable signal /CE and a ready/busy signal R/nB may be exchanged between the memory controller 210 and the plurality of nonvolatile memories 210 through different channels. The memory controller 220 may control the chip enable signal /CE such that the plurality of nonvolatile memories 210 and the plurality of nonvolatile memory chips 211 in each nonvolatile memory 210 may be independently selected. Also, the memory controller 220 may identify whether the plurality of nonvolatile memories 210 and the plurality of nonvolatile memory chips 211 in each of the plurality of nonvolatile memories 210 are at a communication-possible state, based on the ready/busy signal R/nB.

The memory controller 220 may contain pads that are described with reference to FIG. 2. Input/output pads DQ1 through DQk of the memory controller 220 may be connected in common to the plurality of nonvolatile memories 210.

In exemplary embodiments, it is assumed that M nonvolatile memories 210 are connected to the memory controller 220. Also, it is assumed that each of the plurality of nonvolatile memories 210 contains N nonvolatile memory chips 211. In case that the buffer chip is not provided, M*N input/output pads of the plurality of nonvolatile memories 210 may be connected to one input/output pad of the memory controller 220. In contrast, if the buffer chip 213 is provided, M input/output pads of the plurality of nonvolatile memories 210 may be connected to one input/output pad of the memory controller 220. That is, in case that the buffer chip 213 is provided, loading of the memory controller 220 of the solid state drive 200 may be reduced as great as 1/N. Now that skew between the memory controller 220 and the plurality of nonvolatile memories 210 is reduced, the reliability of the solid state drive 200 is improved.

Figure 6:
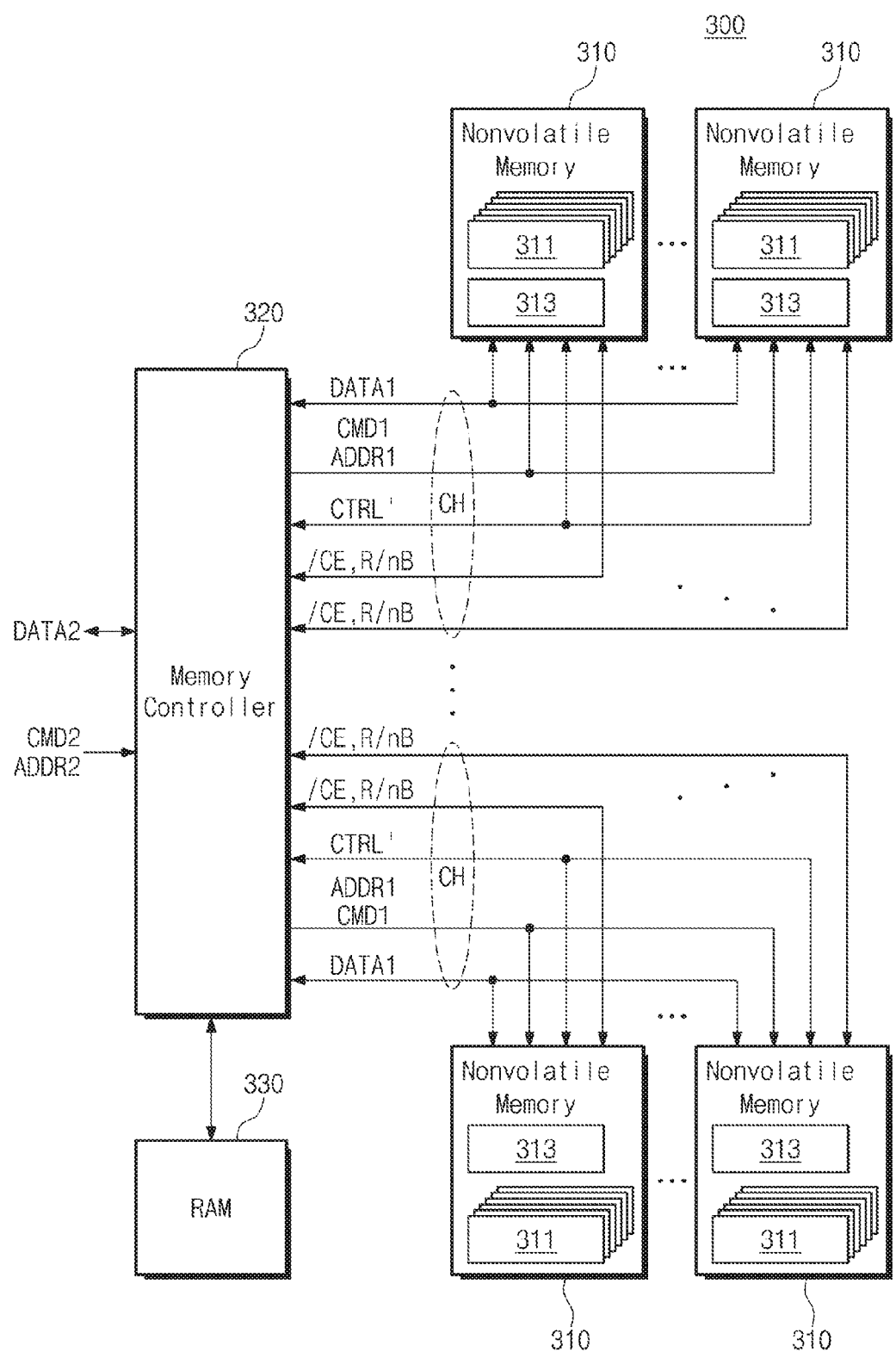
FIG. 6 is a block diagram schematically illustrating a solid state drive according to a third embodiment of the present disclosure.

FIG. 6 is a block diagram schematically illustrating a solid state drive 300 according to a third embodiment of the present disclosure. Referring to FIG. 6, a solid state drive 300 may contain a plurality of nonvolatile memories 310, a memory controller 320, and a RAM 330. Each of the plurality of nonvolatile memories 310 may contain a plurality of nonvolatile memory chips 311 and a buffer chip 313. Each of the plurality of nonvolatile memories 310 may have the same structure as a nonvolatile memory 110 described with reference to FIGS. 1 through 3, and may operate in the same way as the nonvolatile memory 110. The buffer chips 313 may relay between the plurality of nonvolatile memory chips 311 and the memory controller 320.

The plurality of nonvolatile memories 310 may communicate with the memory controller 320 through a plurality of channels CH. The plurality of nonvolatile memories 310 may independently communicate with the memory controller 320 by the plurality of channels CH. In each of the plurality of channels CH, the memory controller 320 may exchange first data DATA1, a first command CMD1, and a first address ADDR1 with the plurality of nonvolatile memories 310 through a common channel. In each of the plurality of channels CH, the memory controller 320 may exchange a control signal CTRL' with the plurality of nonvolatile memories 310 through the common channel. The control signal CTRL' may include a command latch enable signal CLE, an address latch enable signal ALE, a read enable signal /RE, a write enable signal /WE, and a write protection signal /WP.

In each of the plurality of channels CH, a chip enable signal /CE and a ready/busy signal R/nB may be exchanged between the memory controller 320 and the plurality of nonvolatile memories 310 through different channels. In each of the plurality of channels CH, the memory controller 320 may control the chip enable signal /CE such that the plurality of nonvolatile memories 310 and the plurality of nonvolatile memory chips 311 in each of the plurality of nonvolatile memories 310 may be independently selected. Also, in each of the plurality of channels CH, the memory controller 320 may identify whether the plurality of nonvolatile memories 310 and the plurality of nonvolatile memory chips 311 in each of the plurality of nonvolatile memories 310 are at a communication-possible state, based on the ready/busy signal R/nB.

Figure 7:
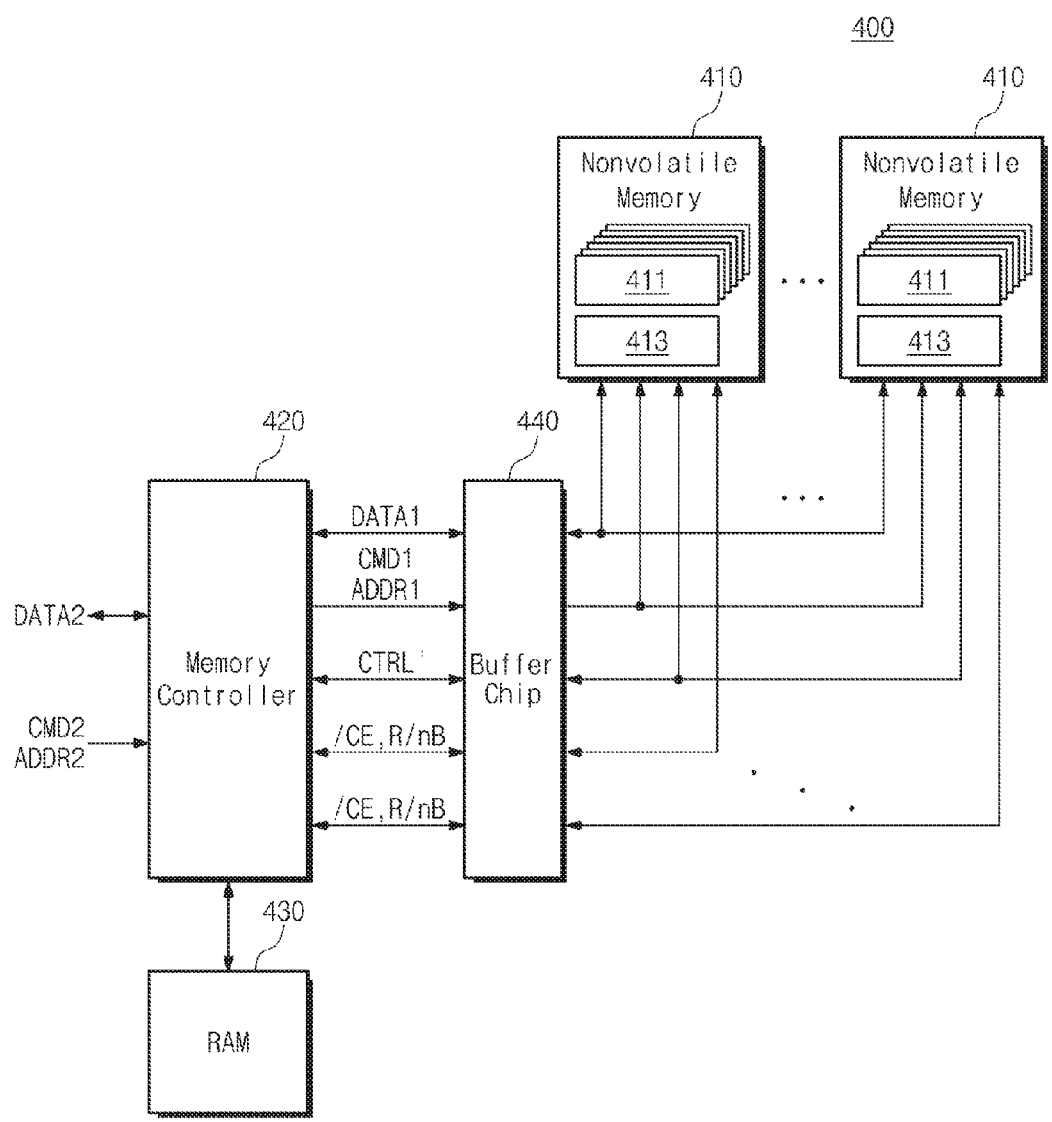
FIG. 7 is a block diagram schematically illustrating a solid state drive according to a fourth embodiment of the present disclosure.

FIG. 7 is a block diagram schematically illustrating a solid state drive 100 according to a fourth embodiment of the present disclosure. Referring to FIG. 7, a solid state drive 400 may contain a plurality of nonvolatile memories 410, a memory controller 420, and a RAM 430. Each of the plurality of nonvolatile memories 410 may contain a plurality of nonvolatile memory chips 411 and a buffer chip 413. Each of the plurality of nonvolatile memories 410 may have the same structure as a nonvolatile memory 110 described with reference to FIGS. 1 through 3, and may operate in the same way as the nonvolatile memory 110.

The solid state drive 400 may be different from a solid state drive 200 shown in FIG. 5 in that the solid state drive 400 further includes a buffer chip 440. The buffer chip 440 may interface communications between the memory controller 420 and the plurality of nonvolatile memories 410. The buffer chip 440 may have the same structure as a buffer chip 113 described with reference to FIGS. 1 through 3, and may operate in the same way as the buffer chip 113.

The memory controller 420 may exchange first data DATA1, a first command CMD1, and a first address ADDR1 with the plurality of nonvolatile memories 410 through the buffer chip 440. The memory controller 420 may exchange a control signal CTRL' with the plurality of nonvolatile memories 410 through the buffer chip 440. The control signal CTRL' may include a command latch enable signal CLE, an address latch enable signal ALE, a read enable signal /RE, a write enable signal /WE, and a write protection signal /WP.

A chip enable signal /CE and a ready/busy signal R/nB may be exchanged between the memory controller 420 and the plurality of nonvolatile memories 410 through the buffer chip 440. The memory controller 420 may control the chip enable signals /CE such that the plurality of nonvolatile memories 410 and the plurality of nonvolatile memory chips 411 in each of the plurality of nonvolatile memories 410 may be independently selected. Also, the memory controller 420 may identify whether the plurality of nonvolatile memories 410 and the plurality of nonvolatile memory chips 411 in each of the plurality of nonvolatile memories 410 are at a communication-possible state, based on the ready/busy signal R/nB.

Figure 8:
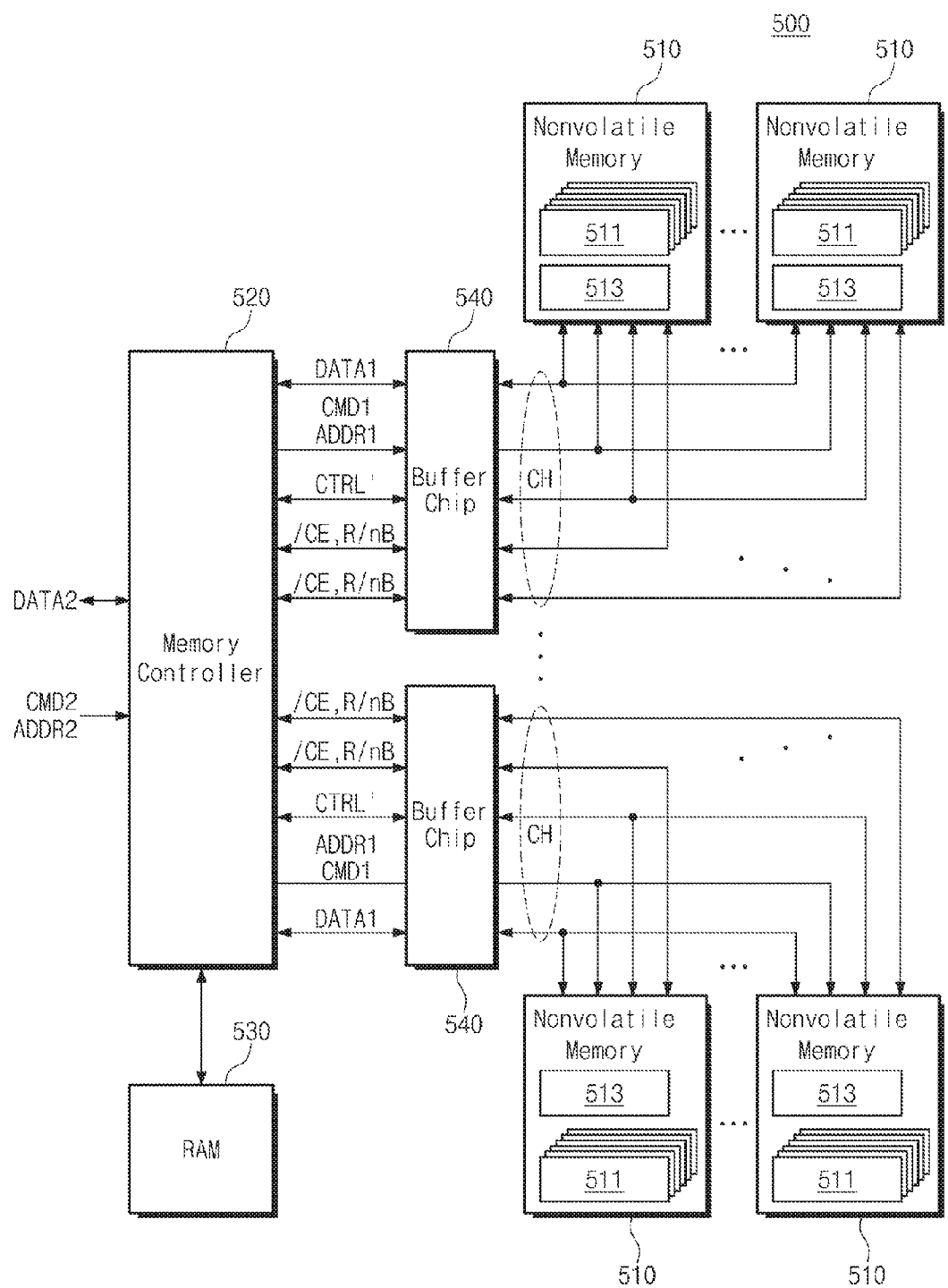
FIG. 8 is a block diagram schematically illustrating a solid state drive according to a fifth embodiment of the present disclosure.

FIG. 8 is a block diagram schematically illustrating a solid state drive 500 according to a fifth embodiment of the present disclosure. Referring to FIG. 8, a solid state drive 500 may contain a plurality of nonvolatile memories 510, a memory controller 520, a RAM 530, and a plurality of buffer chips 540. Each of the plurality of nonvolatile memories 510 may contain a plurality of nonvolatile memory chips 511 and a buffer chip 513. Each of the plurality of nonvolatile memories 510 may have the same structure as a nonvolatile memory 110 described with reference to FIGS. 1 through 3, and may operate in the same way as the nonvolatile memory 110.

As compared with a solid state drive 300 shown in FIG. 6, the solid state drive 500 may further include the plurality of buffer chips 540. The plurality of buffer chips 540 may be arranged to correspond to channels CH, respectively. In each of the plurality of channels CH, one of the plurality of buffer chips 540 and the plurality of nonvolatile memories 510 may be configured the same as described with reference to FIG. 7.

In exemplary embodiments, it is assumed that M nonvolatile memories 510 are implemented on each channel of the solid state drive 500. Also, it is assumed that each of the plurality of nonvolatile memories 510 may contain N nonvolatile memory chips 511. Further, it is assumed that the number of channels CH of the solid state drive 500 is K.

In case that the buffer chips 513 and 540 are not provided, M*N*K input/output pads of the plurality of nonvolatile memories 510 may be connected to one input/output pad of the memory controller 520. In contrast, if the buffer chips 513 and 540 are provided, K input/output pads of the plurality of buffer chips 540 may be connected to one input/output pad of the memory controller 520. One input/output pad of each of the plurality of buffer chips 540 that communicate with the plurality of nonvolatile memories 510 may be connected with M input/output pads of the plurality of nonvolatile memories 510. One input/output pad of each of the buffer chips 513 that communicate with the plurality of nonvolatile memory chips 511 may be connected with N input/output pads of the plurality of nonvolatile memory chips 511.

That is, as described with reference to FIG. 6, the buffer chips 513 and 540 may be hierarchically disposed between the plurality of nonvolatile memory chips 511 and the memory controller 520. If the buffer chips 513 and 540 are hierarchically disposed, loading of input/output pads of the plurality of nonvolatile memory chips 511 may be distributed into a plurality of layers, thereby improving the reliability of the solid state drive 500. In FIG. 8, an embodiment of the present disclosure is exemplified as the solid state drive 500 includes a two-layer buffering structure (i.e., a first layer of buffer chips 513 and a second layer of buffer chips 540). However, the number of layers of buffer chips is not limited to this disclosure.

Figure 9:
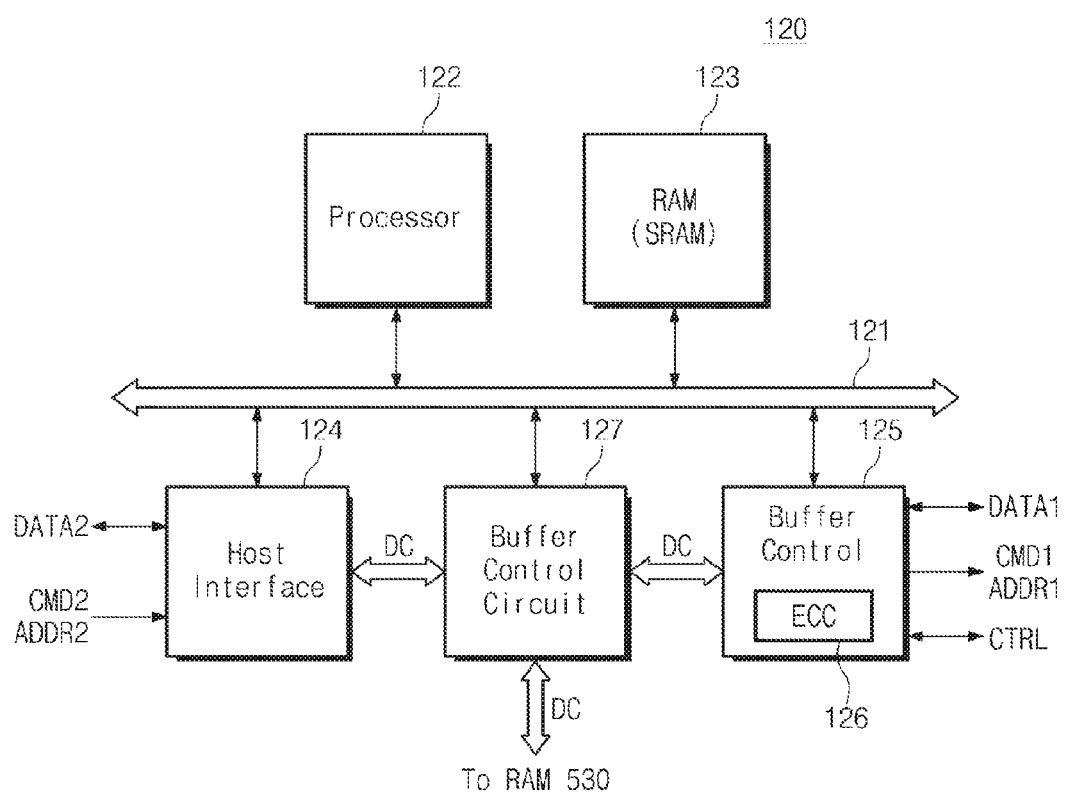
FIG. 9 is a block diagram schematically illustrating a memory controller according to an embodiment of the present disclosure.

FIG. 9 is a block diagram schematically illustrating a memory controller 120 according to an embodiment of the present disclosure. Referring to FIG. 9, a memory controller 120 may contain a bus 121, a processor 122, a RAM 123, a host interface 124, a memory interface 125, and a buffer control circuit 127.

The bus 121 may be configured to provide a channel among components of the memory controller 120. For example, a second command CMD2 and a second address ADDR2 that are provided from an external host device to the memory controller 120 may be transferred to the processor 122 through the bus 121. The processor 122 may produce a first command CMD1 and a first address ADDR1, based on the second command CMD2 and the second address ADDR2. The first command CMD1 and the first address ADDR1 may be transferred to the memory interface 125 through the bus 121. That is, the bus 121 may provide a path through which a command and an address are transferred among the host interface 124, the processor 122, and the memory interface 125. Also, the bus 121 may provide a control channel that enables the processor 122 to control the host interface 124, the memory interface 125, and the buffer control circuit 127. The bus 121 may provide an access channel that enables the processor 122 to access the RAM 123.

The processor 122 may control an overall operation of the memory controller 120 and may execute a logical operation. The processor 122 may communicate with the external host device through the host interface 124. The processor 122 may store, in the RAM 123, the second command CMD2 or the second address ADDR2 received through the host interface 124. The processor 122 may produce a first command CMD1 and a first address ADDR1 according to a command or an address stored in the RAM 123. The processor 122 may output the first command CMD1 and the first address ADDR1 through the memory interface 125.

For example, the second address ADDR2 may be a logical address that is used in a host device, and the first address ADDR1 may be a physical address that is used in a nonvolatile memory 110. The processor 122 may load information, which is used to convert the second address ADDR2 into the first address ADDR1, on the RAM 123, and may refer to the information loaded on the RAM 123.

Under a control of the processor 122, data received through the host interface 124 may be output through the buffer control circuit 127. The data received through the buffer control circuit 127 may be transferred to the memory interface 125 under the control of the processor 122. The data received through the memory interface 125 may be output through the buffer control circuit 127 according to the control of the processor 122. Under the control of the processor 122, the data received through the buffer control circuit 127 may be output through the host interface 124 or the memory interface 125.

The RAM 123 may be used as a working memory, a cache memory, or a buffer memory of the processor 122. The RAM 123 may store codes or instructions that the processor 122 will execute. The RAM 123 may store data processed by the processor 122. The RAM 123 may include an SRAM.

The host interface 124 may communicate with the external host according to the control of the processor 122. The host interface 124 may communicate using at least one of various communication manners such as USB (Universal Serial Bus), SATA (Serial AT Attachment), HSIC (High Speed Interchip), SCSI (Small Computer System Interface), Firewire, PCI (Peripheral Component Interconnection), PCIe (PCI express), NVMe (NonVolatile Memory express), UFS (Universal Flash Storage), SD (Secure Digital), MMC (MultiMedia Card), eMMC (embedded MMC), and so on.

The host interface 124 may transfer the second command CMD2 and the second address ADDR2 received from the host device to the processor 122 through the bus 121. The host interface 124 may transmit the second data DATA2 received from the host device to the buffer control circuit 127 through a data channel DC. The host interface 124 may output the second data DATA2 received from the buffer control circuit 127 to the host device.

The memory interface 125 may be configured to communicate with the nonvolatile memory 110 according to the control of the processor 122. The memory interface 125 may receive the first command CMD1 and the first address ADDR1 from the processor 122 through the bus 121. The memory interface 125 may output the first command CMD1 and the first address ADDR1 to the nonvolatile memory 110. Also, the memory interface 125 may produce a control signal CTRL using the first command CMD1 and the first address ADDR1, and may output the control signal CTRL to the nonvolatile memory 110.

The memory interface 125 may receive the first data DATA1 from the buffer control circuit 127 through a data channel DC. The memory interface 125 may output the first data DATA1 received through the data channel DC to the nonvolatile memory 110. The memory interface 125 may receive the control signal CTRL and the first data DATA1 from the nonvolatile memory 110. The memory interface 125 may transmit the first data DATA1 received from the nonvolatile memory 110 to the buffer control circuit 127 through the data channel DC.

The memory interface 125 may contain an error correction code (ECC) block 126. The ECC block 126 may perform an error correction operation. The ECC block 126 may generate parity for error correction, based on data to be output to the nonvolatile memory 110 through the memory interface 125. Data and parity may be written at the nonvolatile memory 110. When the first data DATA1 is received from the nonvolatile memory 110, parity associated with the first data DATA1 may be also received. The ECC block 126 may correct an error of the first data DATA1 using the first data DATA1 and the associated parity that are received through the memory interface 125.

The buffer control circuit 127 may be configured to control the RAM 123 according to the control of the processor 122. The buffer control circuit 127 may write data at the RAM 123 and read data from the RAM 123. The buffer control circuit 127 may directly exchange data with RAM 530 of FIG. 8 (or RAMs 130, 230, 330 or 430 of respective FIGS. 1, 5, 6 and 7) through a data channel DC without passing through the internal bus 121.

In exemplary embodiments, the processor 122 may control the memory controller 120 using codes. The processor 122 may read codes from a nonvolatile memory (e.g., read only memory) that is implemented in the memory controller 120, and may store the read codes at the RAM 123 for execution. Or, the processor 122 may store the codes received through the memory interface 125 at the RAM 123 for execution.

In exemplary embodiments, the memory interface 125 or the processor 122 may further perform randomization on the first data DATA1 to be written at the nonvolatile memory 110. Randomization may be an operation of coding the first data DATA1 randomly or according to a predetermined rule, thereby preventing a specific pattern from being generated in the first data DATA1. Also, the memory interface 125 or the processor 122 may perform de-randomization on the first data DATA1 read from the nonvolatile memory 110.

In exemplary embodiments, the memory interface 125 or the processor 122 may further perform encryption to improve security of the first data DATA1 to be written at the nonvolatile memory 110. The memory interface 125 or the processor 122 may further perform decryption on the first data DATA1 read from the nonvolatile memory 110. The encryption and decryption may be made according to the standardized protocols such as DES (Data Encryption Standard), AES (Advanced Encryption Standard), and so on.

In exemplary embodiments, the memory controller 120 may be configured to provide an auxiliary power. For example, the memory controller 120 may store power supplied from a host device at a storing place such as a super cap. At sudden power-off, the memory controller 120 may back up an operating state of the memory controller 120 or write data that is not yet stored in the nonvolatile memory 110, using the auxiliary power. The memory controller 120 may perform a normal power-off sequence using the auxiliary power.

Figure 10:
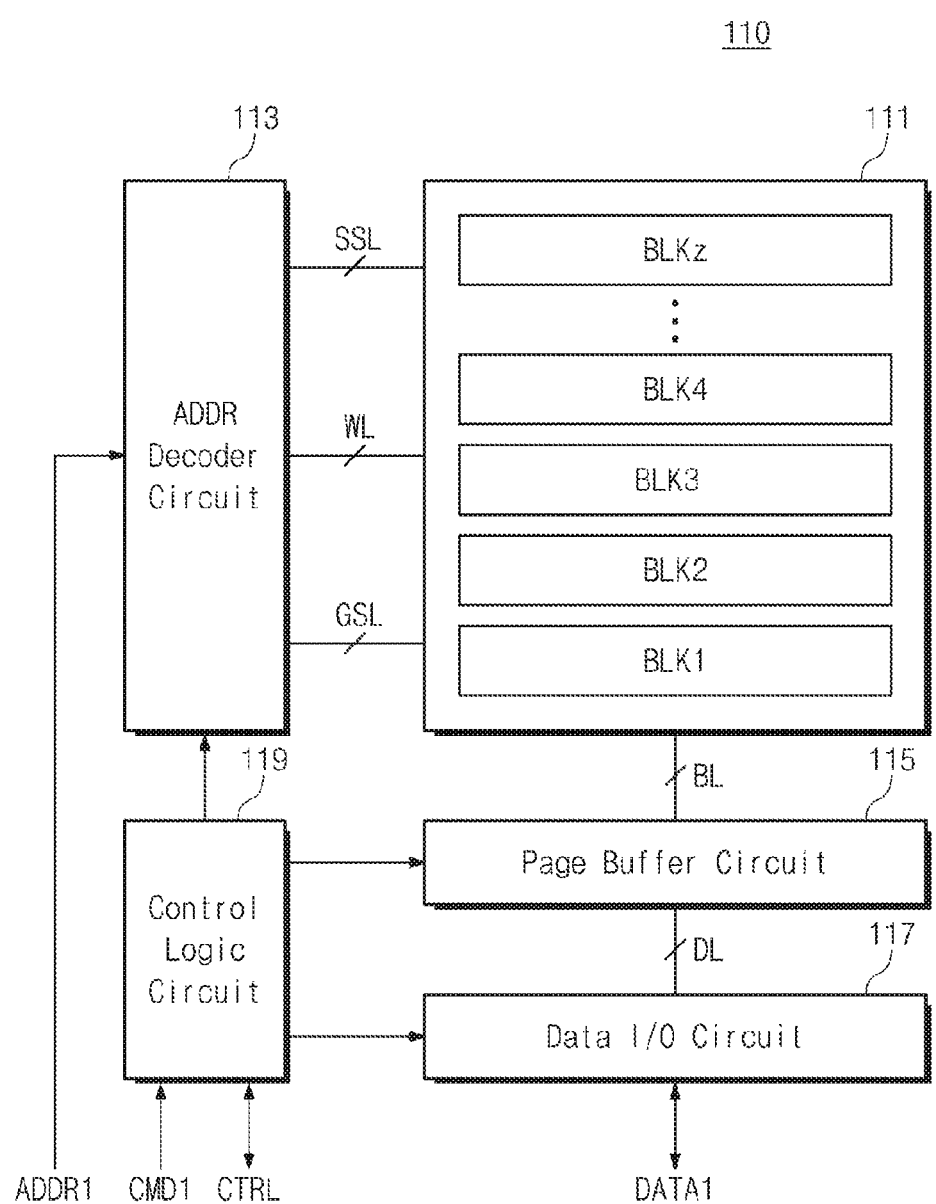
FIG. 10 is a block diagram schematically illustrating a nonvolatile memory according to an embodiment of the present disclosure.

FIG. 10 is a block diagram schematically illustrating a nonvolatile memory 110 according to an embodiment of the present disclosure. Referring to FIG. 10, a nonvolatile memory 110 may include a memory cell array 111, an address decoder circuit 113, a page buffer circuit 115, a data input/output circuit 117, and a control logic circuit 119.

The memory cell array 111 may include a plurality of memory blocks BLK1 through BLKz, each of which has a plurality of memory cells. Each of the plurality of memory blocks BLK1 through BLKz may be connected to the address decoder circuit 113 through at least one string selection line SSL, a plurality of word lines WL, and at least one ground selection line GSL. Each of the plurality of memory blocks BLK1 through BLKz may be connected to the page buffer circuit 115 through a plurality of bit lines BL. The plurality of memory blocks BLK1 through BLKz may be connected in common to the plurality of bit lines BL. Memory cells of the plurality of memory blocks BLK1 through BLKz may have the same structure. In exemplary embodiments, each of the plurality of memory blocks BLK1 through BLKz may be a unit of an erase operation. The erase operation may be carried out by the memory block. Memory cells of a memory block may be erased at the same time.

The address decoder circuit 113 may be connected to the memory cell array 111 through a plurality of ground selection lines GSL, the plurality of word lines WL, and a plurality of string selection lines SSL. The address decoder circuit 113 may operate in response to a control of the control logic circuit 119. The address decoder circuit 113 may receive a first address ADDR1 from a memory controller 120. The address decoder circuit 113 may decode the first address ADDR1 and may control voltages to be applied to the plurality of word lines WL according to the decoded address.

For example, at programming, the address decoder circuit 113 may apply a program voltage to a selected word line of a selected memory block that the first address ADDR1 points out. The address decoder circuit 113 may also apply a pass voltage to unselected word lines of the selected memory block. At reading, the address decoder circuit 113 may apply a selection read voltage to a selected word line of a selected memory block that the first address ADDR1 points out. The address decoder circuit 113 may also apply a non-selection read voltage to unselected word lines of the selected memory block. At erasing, the address decoder circuit 113 may apply an erase voltage (e.g., ground voltage) to word lines of a selected memory block that the first address ADDR1 points out.

The page buffer circuit 115 may be connected to the memory cell array 111 through the bit lines BL. The page buffer circuit 115 may be connected to the data input/output circuit 117 through a plurality of data lines DL. The page buffer circuit 115 may operate in response to the control of the control logic circuit 119.

The page buffer circuit 115 may hold data to be programmed at memory cells of the memory cell array 111 or data read from memory cells thereof. During a program operation, the page buffer circuit 115 may store data to be stored in memory cells. The page buffer circuit 115 may bias the plurality of bit lines BL based on the stored data. The page buffer circuit 115 may function as a write driver at a program operation. During a read operation, the page buffer circuit 115 may sense voltages of the plurality of bit lines BL and may store the sensed results. The page buffer circuit 115 may function as a sense amplifier at a read operation.

The data input/output circuit 117 may be connected to the page buffer circuit 115 through the plurality of data lines DL. The data input/output circuit 117 may exchange first data DATA1 with the memory controller 120.

The data input/output circuit 117 may temporarily store first data DATA1 the memory controller 120 provides, and the data input/output circuit 117 may transfer the temporarily stored data to the page buffer circuit 115. The data input/output circuit 117 may temporarily store data transferred from the page buffer circuit 115 and may transfer the data to the memory controller 120. The data input/output circuit 117 may function as a buffer memory.

The control logic circuit 119 may receive a first command CMD1 and a control signal CTRL from the memory controller 120. The control logic circuit 119 may decode the first command CMD1 thus received and may control an overall operation of the nonvolatile memory 110 according to the decoded command.

In exemplary embodiments, at a read operation, the control logic circuit 119 may produce a data strobe signal DQS from a read enable signal /RE of the control signal CTRL, and may output the data strobe signal DQS. At a write operation, the control logic circuit 119 may output the data strobe signal DQS from the read enable signal /RE of the control signal CTRL.

Figure 11:
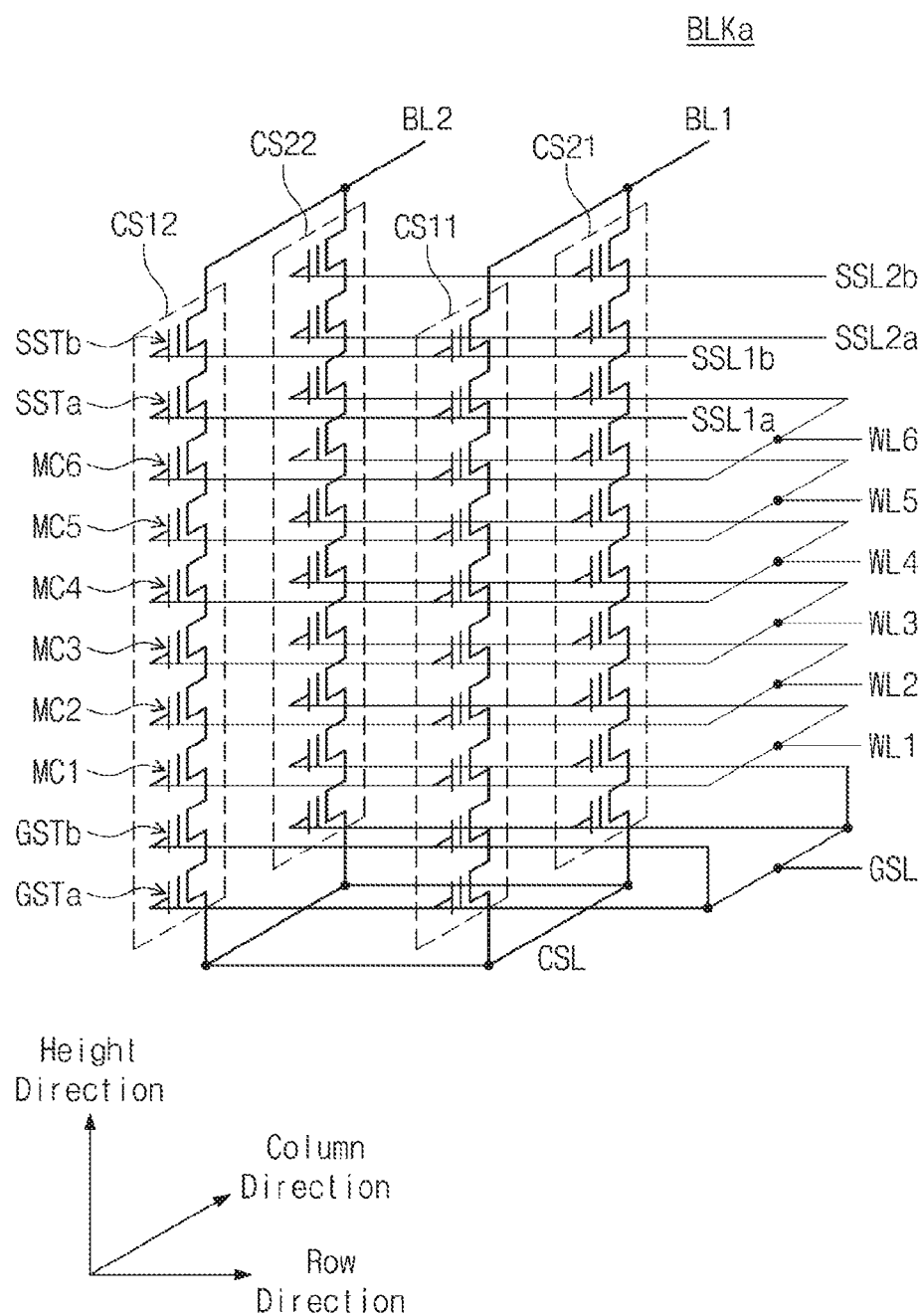
FIG. 11 is a circuit diagram schematically illustrating a memory block according to an embodiment of the present disclosure.

FIG. 11 is a circuit diagram schematically illustrating a memory block BLKa according to an embodiment of the present disclosure. Referring to FIG. 11, a memory block BLKa may include a plurality of cell strings CS11 through CS21 and CS12 through CS22. The plurality of cell strings CS11 through CS21 and CS12 through CS22 may be arranged along a row direction and a column direction, and may form rows and columns.

For example, the cell strings CS11 and CS12 arranged along the row direction may form a first row, and the cell strings CS21 and CS22 arranged along the row direction may form a second row. The cell strings CS11 and CS21 arranged along the column direction may form a first column, and the cell strings CS12 and CS22 arranged along the column direction may form a second column.

Each cell string may contain a plurality of cell transistors. The plurality of cell transistors may include ground selection transistors GSTa and GSTb, memory cells MC1 through MC6, and string selection transistors SSTa and SSTb. The ground selection transistors GSTa and GSTb, memory cells MC1 through MC6, and string selection transistors SSTa and SSTb of each cell string may be stacked in a height direction perpendicular to a plane (e.g., plane above a substrate of the memory block BLKa) on which the cell strings CS11 through CS21 and CS12 through CS22 are arranged along rows and columns.

Each cell transistor may be formed of a charge trap type cell transistor of which the threshold voltage varies with the amount of charge trapped in its insulation layer.

Lowermost ground selection transistors GSTa may be connected in common to a common source line CSL.

The ground selection transistors GSTa and GSTb of the plurality of cell strings CS11 through CS21 and CS12 through CS22 may be connected in common to a ground selection line GSL.

In exemplary embodiments, ground selection transistors with the same height (or, order) may be connected to the same ground selection line, and ground selection transistors with different heights (or, orders) may be connected to different ground selection lines. For example, the ground selection transistors GSTa with a first height may be connected in common to a first ground selection line, and the ground selection transistors GSTb with a second height may be connected in common to a second ground selection line.

In exemplary embodiments, ground selection transistors in the same row may be connected to the same ground selection line, and ground selection transistors in different rows may be connected to different ground selection lines. For example, the ground selection transistors GSTa and GSTb of the cell strings CS11 and CS12 in the first row may be connected in common to the first ground selection line, and the ground selection transistors GSTa and GSTb of the cell strings CS21 and CS22 in the second row may be connected in common to the second ground selection line.

Memory cells that are placed at the same height (or, order) from the substrate (or, the ground selection transistors GST) may be connected in common to a word line. Memory cells that are placed at different heights (or, orders) may be connected to different word lines WL1 through WL6. For example, the memory cells MC1 may be connected in common to the word line WL1, the memory cells MC2 may be connected in common to the word line WL2, and the memory cells MC3 may be connected in common to the word line WL3. The memory cells MC4 may be connected in common to the word line WL4, the memory cells MC5 may be connected in common to the word line WL5, and the memory cells MC6 may be connected in common to the word line WL6.

In first string selection transistors SSTa, having the same height (or, order), of the cell strings CS11 through CS21 and CS12 through CS22, the first string selection transistors SSTa in different rows may be connected to different string selection lines SSL1a and SSL2a. For example, the first string selection transistors SSTa of the cell strings CS11 and CS12 may be connected in common to the string selection line SSL1a, and the first string selection transistors SSTa of the cell strings CS21 and CS22 may be connected in common to the string selection line SSL2a.

In second string selection transistors SSTb, having the same height (or, order), of the cell strings CS11 through CS21 and CS12 through CS22, the second string selection transistors SSTb in different rows may be connected to the different string selection lines SSL1b and SSL2b. For example, the second string selection transistors SSTb of the cell strings CS11 and CS12 may be connected in common to the string selection line SSL1b, and the second string selection transistors SSTb of the cell strings CS21 and CS22 may be connected in common to the string selection line SSL2b.

That is, cell strings in different rows may be connected to different string selection lines. String selection transistors, having the same height (or, order), of cell strings in the same row may be connected to the same string selection line. String selection transistors, having different heights (or, orders), of cell strings in the same row may be connected to different string selection lines.

In exemplary embodiments, string selection transistors of cell strings in the same row may be connected in common to a string selection line. For example, string selection transistors SSTa and SSTb of cell strings CS11 and CS12 in the first row may be connected in common to a string selection line, and string selection transistors SSTa and SSTb of cell strings CS21 and CS22 in the second row may be connected in common to a string selection line.

Columns of the cell strings CS11 through CS21 and CS12 through CS22 may be connected to different bit lines BL1 and BL2, respectively. For example, string selection transistors SSTb of the cell strings CS11 and CS21 in the first column may be connected in common to the bit line BL1, and string selection transistors SSTb of the cell strings CS12 and CS22 in the second column may be connected in common to the bit line BL2.

The cell strings CS11 and CS12 may form a first plane, and the cell strings CS21 and CS22 may form a second plane.

A write operation and a read operation of the memory block BLKa may be performed by the row. For example, one plane may be selected by the string selection lines SSL1a, SSL1b, SSL2a, and SSL2b. Cell strings CS11 and CS12 of the first plane may be connected to the bit lines BL1 and BL2 when a turn-on voltage is applied to the string selection lines SSL1a and SSL1b and a turn-off voltage is supplied to the string selection lines SSL2a and SSL2b. That is, the first plane may be selected. Cell strings CS21 and CS22 of the second plane may be connected to the bit lines BL1 and BL2 when the turn-on voltage is applied to the string selection lines SSL2a and SSL2b and the turn-off voltage is supplied to the string selection lines SSL1a and SSL1b. That is, the second plane may be selected. In a selected plane, a row of memory cells may be selected by word lines WL1 to WL6. The read operation or the write operation may be performed with respect to the selected row.

An erase operation on the memory block BLKa may be performed by the block or by the sub block. All of memory cells of a memory block BLKa may be erased when the erase operation is performed by the memory block. When the erase operation is performed by the sub block, a part of memory cells of the memory block BLKa may be erased and the rest thereof may be erase-inhibited. A low voltage (e.g., ground voltage) may be supplied to a word line connected to memory cells to be erased, and a word line connected to memory cells to be erase-inhibited may be floated.

The memory block BLKa shown in FIG. 11 is exemplary. However, the present disclosure is not limited thereto. For example, the number of rows of cell strings may increase or decrease. If the number of rows of cell strings is changed, the number of string or ground selection lines and the number of cell strings connected to a bit line may also be changed.

The number of columns of cell strings may increase or decrease. If the number of columns of cell strings is changed, the number of bit lines connected to columns of cell strings and the number of cell strings connected to a string selection line may also be changed.

A height of the cell strings may increase or decrease. For example, the number of ground selection transistors, memory cells, or string selection transistors that are stacked in each cell string may increase or decrease.

Figure 12:
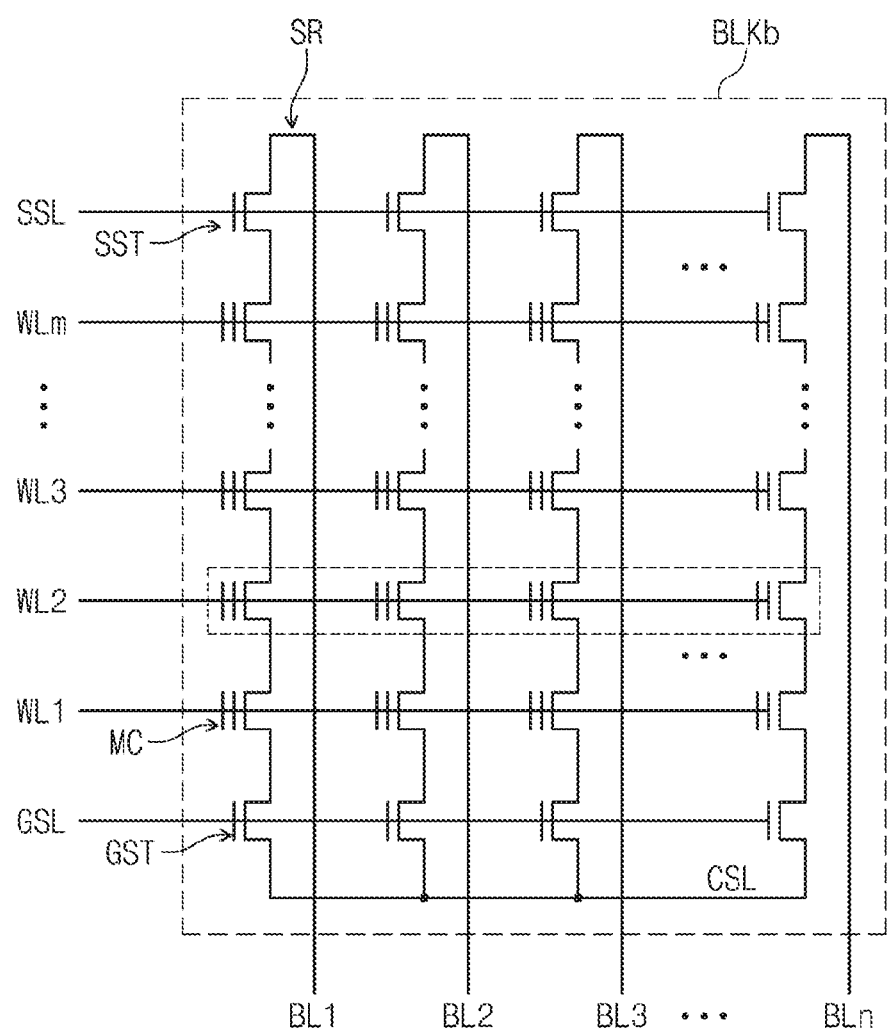
FIG. 12 is a circuit diagram schematically illustrating a memory block according to another embodiment of the present disclosure.

FIG. 12 is a circuit diagram schematically illustrating a memory block BLKb according to another embodiment of the present disclosure. Referring to FIG. 12, a memory block BLKb may include a plurality of strings SR, which are connected to a plurality of bit lines BL1 through BLn, respectively. Each of the plurality of strings SR may contain a ground selection transistor GST, memory cells MC, and a string selection transistor SST.

In each of the plurality of strings SR, the ground selection transistor GST may be connected between the memory cells MC and a common source line CSL. The ground selection transistors GST of the plurality of strings SR may be connected in common to the common source line CSL.

In each of the plurality of strings SR, the string selection transistor SST may be connected between the memory cells MC and a bit line BL. The string selection transistors SST of the plurality of strings SR may be connected to a plurality of bit lines BL1 through BLn, respectively.

In each of the plurality of strings SR, the plurality of memory cells MC may be connected between the ground selection transistor GST and the string selection transistor SST. In each of the plurality of strings SR, the plurality of memory cells MC may be connected in series.

In the plurality of strings SR, memory cells MC having the same height from the common source line CSL may be connected in common to a word line. The memory cells MC of the plurality of strings SR may be connected to a plurality of word lines WL1 through WLm.

In the memory block BLKb, an erase operation may be performed by the memory block. When the erase operation is performed by the memory block, all memory cells of the memory block BLKb may be simultaneously erased according to an erase request.

Figure 13:
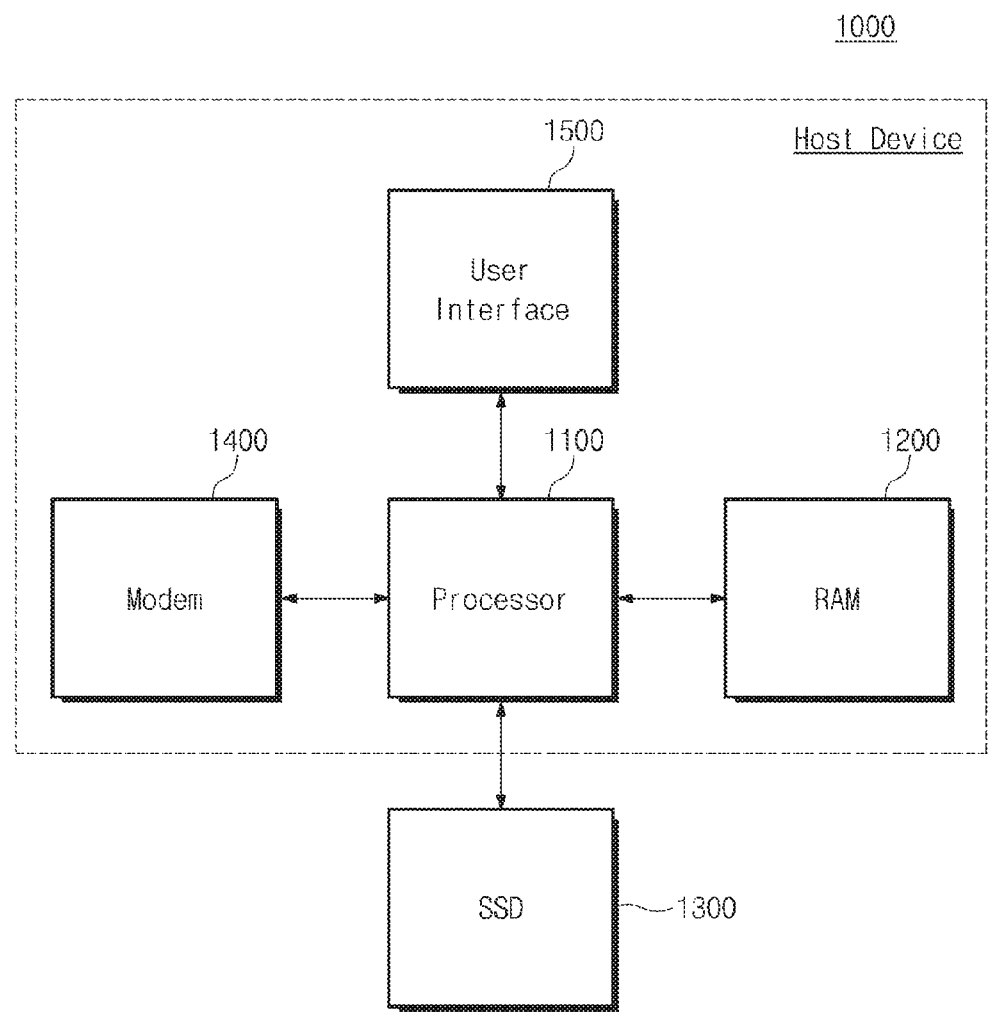
FIG. 13 is a block diagram schematically illustrating a computing device according to an embodiment of the present disclosure.

FIG. 13 is a block diagram schematically illustrating a computing device 1000 according to an embodiment of the present disclosure. Referring to FIG. 13, a computing device 1000 may include a processor 1100, a RAM 1200, a solid state drive 1300, a modem 1400, and a user interface 1500.

The processor 1100 may control an overall operation of the computing device 1000 and may perform a logical operation. The processor 1100 may be formed of a system-on-chip (SoC). The processor 1100 may be a general purpose processor, a specific-purpose processor, or an application processor.

The RAM 1200 may communicate with the processor 1100. The RAM 1200 may be a main memory of the processor 1100 or the computing device 1000. The processor 1100 may store codes or data in the RAM 1200 temporarily. The processor 1100 may execute codes using the RAM 1200 to process data. The processor 1100 may execute a variety of software, such as, but not limited to, an operating system and an application, using the RAM 1200. The processor 1100 may control an overall operation of the computing device 1000 using the RAM 1200. The RAM 1200 may include a volatile memory such as, but not limited to, a static RAM, a dynamic RAM, a synchronous DRAM and so on, or a nonvolatile memory such as, but not limited to, a Phase-change RAM (PRAM), a Magnetic RAM (MRAM), a Resistive RAM (RRAM), a Ferroelectric RAM (FRAM) and so on.

The solid state drive 1300 may communicate with the processor 1100. The solid state drive 1300 may be used to store data for a long time. That is, the processor 110 may store data, which is to be stored for a long time, in the solid state drive 1300. The solid state drive 1300 may store a boot image for driving the computing device 1000. The solid state drive 1300 may store source codes of a variety of software, such as an operating system and an application. The solid state drive 1300 may store data that is processed by a variety of software, such as the operating system and the application.

In exemplary embodiments, the processor 1100 may load source codes stored in the solid state drive 1300 on the RAM 1200. The codes loaded on the RAM 1200 may be executed to run a variety of software, such as an operating system, an application, and so on. The processor 1100 may load data stored in the solid state drive 1300 on the RAM 1200 and may process data loaded on the RAM 1200. The processor 1100 may store long-term data of data stored in the RAM 1200 at the solid state drive 1300.

The solid state drive 1300 may include a nonvolatile memory, such as, but not limited to, a flash memory, a Phase-change RAM (PRAM), a Magnetic RAM (MRAM), a Resistive RAM (RRAM), a Ferroelectric RAM (FRAM), and so on.

The modem 1400 may communicate with an external device according to a control of the processor 1100. For example, the modem 1400 may communicate with the external device in a wire or wireless manner. The modem 1400 may communicate with the external device, based on at least one of wireless communications manners such as LTE (Long Term Evolution), WiMax, GSM (Global System for Mobile communication), CDMA (Code Division Multiple Access), Bluetooth, NFC (Near Field Communication), WiFi, RFID (Radio Frequency Identification), or wire communications manners such as USB (Universal Serial Bus), SATA (Serial AT Attachment), HSIC (High Speed Interchip), SCSI (Small Computer System Interface), Firewire, PCI (Peripheral Component Interconnection), PCIe (PCI express), NVMe (NonVolatile Memory express), UFS (Universal Flash Storage), SD (Secure Digital), SDIO, UART (Universal Asynchronous Receiver Transmitter), SPI (Serial Peripheral Interface), HS-SPI (High Speed SPI), RS232, I2C (Inter-integrated Circuit), HS-I2C, I2S, (Integrated-interchip Sound), S/PDIF (Sony/Philips Digital Interface), MMC (MultiMedia Card), eMMC (embedded MMC).

The user interface 1500 may communicate with a user according to a control of the processor 1100. For example, the user interface 1500 may include user input interfaces such as a keyboard, a keypad, a button, a touch panel, a touch screen, a touch pad, a touch ball, a camera, a microphone, a gyroscope sensor, a vibration sensor, and so on. The user interface 1500 may further include user output interfaces such as an LCD, an OLED (Organic Light Emitting Diode) display device, an AMOLED (Active Matrix OLED) display device, an LED, a speaker, a motor, and so on.

The solid state drive 1300 may include at least one of solid state drives 100, 200, 300, 400, and 500 according to embodiments of the present disclosure. The processor 1100, the RAM 1200, the modem 1400, and the user interface 1500 may constitute a host device that communicates with the solid state drive 1300.

While the present disclosure has been described with reference to exemplary embodiments, it will be apparent to those skilled in the art that various changes and modifications may be made without departing from the spirit and scope of the present disclosure. Therefore, it should be understood that the above embodiments are not limiting, but illustrative.

What is claimed is:

1. A solid state drive comprising:
   a nonvolatile memory including a plurality of nonvolatile memory chips and a buffer chip;
   a first random access memory (RAM); and
   a memory controller configured to control the nonvolatile memory and the first RAM,
   wherein the buffer chip is connected between the plurality of nonvolatile memory chips of the nonvolatile memory and the memory controller, and
   wherein the memory controller comprises:
   an internal bus;
   a host interface configured to communicate with an external host device;
   a memory interface configured to communicate with the nonvolatile memory;
   a buffer control circuit configured to directly exchange data with the host interface without passing through the internal bus, configured to directly exchange the data with the memory interface without passing through the internal bus, and configured to directly exchange the data with the first RAM without passing through the internal bus; and
   a processor configured to receive a first command and a first address from the host interface through the internal bus, configured to produce a second command and a second address respectively from the first command and the first address, configured to transmit the second command and the second address to the memory interface through the internal bus, and configured to control the buffer control circuit through the internal bus,
   wherein each of the plurality of nonvolatile memory chips of the nonvolatile memory are configured to respectively transmit a ready/busy signal to the buffer chip through different respective ready/busy lines, and wherein the buffer chip is configured to respectively transmit the ready/busy signal from each of the plurality of nonvolatile memory chips to the memory controller through different respective second ready/busy lines.

2. The solid state drive of claim 1, wherein the memory controller further comprises a second RAM configured to temporarily store the first command, the first address, the second command, and the second address provided through the internal bus.

3. The solid state drive of claim 1, wherein the memory interface is connected with the buffer chip of the nonvolatile memory through a plurality of first input/output lines,
   wherein the second command and the second address are transferred from the memory interface to the buffer chip through the plurality of first input/output lines, and
   wherein the data is exchanged between the memory interface and the buffer chip through the plurality of first input/output lines.

4. The solid state drive of claim 3, wherein the buffer chip of the nonvolatile memory is connected in common to the plurality of nonvolatile memory chips of the nonvolatile memory through a plurality of second input/output lines,
 wherein the second command and the second address are transmitted from the buffer chip to the plurality of nonvolatile memory chips of the nonvolatile memory through the plurality of second input/output lines, and
 wherein the data is exchanged between the buffer chip and the plurality of nonvolatile memory chips of the nonvolatile memory through the plurality of second input/output lines.

5. The solid state drive of claim 1, wherein the memory interface is configured to transmit a data strobe signal, a read enable signal, a command latch enable signal, an address latch enable signal, a write enable signal and a write protection signal to the buffer chip through control lines.

6. The solid state drive of claim 1, wherein the buffer chip is configured to transmit a data strobe signal, a read enable signal, a command latch enable signal, an address latch enable signal, a write enable signal and a write protection signal in common to the plurality of nonvolatile memory chips of the nonvolatile memory through control lines.

7. The solid state drive of claim 1, wherein the buffer chip is configured to provide the plurality of nonvolatile memory chips with chip enable signals corresponding to the plurality of nonvolatile memory chips of the nonvolatile memory through chip enable lines.

8. The solid state drive of claim 1, further comprising a plurality of first nonvolatile memories,
 wherein the nonvolatile memory and the plurality of first nonvolatile memories are configured to communicate with the memory interface through a first common channel, and
 wherein each of the plurality of first nonvolatile memories has a same structure as the nonvolatile memory.

9. The solid state drive of claim 8, wherein at the first common channel, the nonvolatile memory and the plurality of first nonvolatile memories are configured to use, in common, input/output lines through which the second command, the second address, and the data are transmitted.

10. The solid state drive of claim 8, wherein at the first common channel, the nonvolatile memory and the plurality of first nonvolatile memories are configured to receive chip enable signals through separate chip enable lines.

11. The solid state drive of claim 8, further comprising a plurality of second nonvolatile memories,
 wherein the plurality of second nonvolatile memories are configured to communicate with the memory interface through a second common channel, and
 wherein each of the plurality of second nonvolatile memories has a same structure as the nonvolatile memory.

12. The solid state drive of claim 11, wherein the nonvolatile memory and the plurality of first nonvolatile memories are configured to communicate the second command, the second address and the data through first input/output lines of the first common channel, and
 the plurality of second nonvolatile memories are configured to communicate the second command, the second address and the data through second input/output lines of the second common channel.

13. The solid state drive of claim 1, wherein each of the plurality of nonvolatile memory chips of the nonvolatile memory includes a plurality of cell strings arranged on a substrate along rows and columns, and
 wherein each of the plurality of cell strings includes at least one ground selection transistor, a plurality of memory cells, and at least one string selection transistor sequentially stacked on the substrate in a direction perpendicular to the substrate.

14. The solid state drive of claim 1, wherein the memory interface is configured to transmit chip enable signals to the plurality of nonvolatile memory chips of the nonvolatile memory through a plurality of chip enable lines.

15. A solid state drive comprising:
 a nonvolatile memory including a plurality of nonvolatile memory chips and a buffer chip;
 a random access memory (RAM); and
 a memory controller configured to control the nonvolatile memory and the RAM,
 wherein the buffer chip is connected between the plurality of nonvolatile memory chips of the nonvolatile memory and the memory controller,
 wherein each of the plurality of nonvolatile memory chips of the nonvolatile memory comprises a plurality of cell strings arranged on a substrate along rows and columns,
 wherein each of the plurality of cell strings includes at least one ground selection transistor, a plurality of memory cells, and at least one string selection transistor sequentially stacked on the substrate in a direction perpendicular to the substrate, and
 wherein each of the plurality of nonvolatile memory chips of the nonvolatile memory are configured to respectively transmit a ready/busy signal to the buffer chip through different respective ready/busy lines, and
 wherein the buffer chip is configured to respectively transmit the ready/busy signal from each of the plurality of the nonvolatile memory chips to the memory controller through different respective second ready/busy lines.

\* \* \* \* \*